United States Patent
Koike

(10) Patent No.: US 12,392,645 B2
(45) Date of Patent: Aug. 19, 2025

(54) MAGNET FIXING IMPLEMENT

(71) Applicant: c/o ALPS ALPINE CO., LTD., Tokyo (JP)

(72) Inventor: Tatsuo Koike, Tokyo (JP)

(73) Assignee: ALPS ALPINE CO., LTD., Tokyo (JP)

( * ) Notice: Subject to any disclaimer, the term of this patent is extended or adjusted under 35 U.S.C. 154(b) by 495 days.

(21) Appl. No.: 17/931,180

(22) Filed: Sep. 12, 2022

(65) Prior Publication Data
US 2023/0003561 A1   Jan. 5, 2023

Related U.S. Application Data

(63) Continuation of application No. PCT/JP2021/013542, filed on Mar. 30, 2021.

(30) Foreign Application Priority Data

Apr. 2, 2020   (JP) .................................. 2020-066968
Jun. 12, 2020   (JP) .................................. 2020-102578

(51) Int. Cl.
  *G01D 13/22*   (2006.01)
  *G01R 1/08*   (2006.01)

(52) U.S. Cl.
  CPC ............. *G01D 13/22* (2013.01); *G01R 1/08* (2013.01)

(58) Field of Classification Search
  CPC ........ G01D 13/22; G01D 5/145; G01D 11/30; G01D 5/12; G01R 1/08; G08C 19/00; G12B 5/00; G01B 7/30
  See application file for complete search history.

(56) References Cited

U.S. PATENT DOCUMENTS 1,391,279 A * 9/1921 Seignol .................... G01P 1/08
                                                340/815.78
6,120,158 A * 9/2000 Ishimaru .................. B60Q 3/64
                                                116/48

(Continued)

FOREIGN PATENT DOCUMENTS

| JP | S60-027320 U | 2/1985 |
| JP | H11-044556 | 2/1999 |
| JP | 3161399 U | 7/2010 |

OTHER PUBLICATIONS

JP-2002323350-A; Atsumi "Pointer Type Display Device", 2002. (Year: 2002).*

(Continued)

*Primary Examiner* — Kristina M Deherrera
*Assistant Examiner* — Tania Courson
(74) *Attorney, Agent, or Firm* — IPUSA, PLLC

(57) ABSTRACT

A magnet fixing implement for fixing a magnet for rotation angle detection, attached to a rotation center portion of an indicator needle of an analog meter, includes a main body, a magnet holder provided on an upper surface of the main body, and configured to hold the magnet at a rotation center of the indicator needle, a slit formed in the main body in a flat shape perpendicular to the rotation center, and configured to accommodate the rotation center portion of the indicator needle, a rotation shaft holder provided below the slit of the main body, and configured to hold a rotation shaft of the indicator needle, and an indicator needle restricting portion protruding toward an outer side from an outer peripheral edge of the main body, and configured to restrict a rotation of the indicator needle with respect to the main body.

9 Claims, 20 Drawing Sheets

(56) References Cited

U.S. PATENT DOCUMENTS

| | | | | |
|---|---|---|---|---|
| 8,356,570 | B2* | 1/2013 | Masuda | G01D 13/22 |
| | | | | 116/288 |
| 8,365,681 | B2* | 2/2013 | Masuda | G01D 5/06 |
| | | | | 116/303 |
| 9,404,772 | B2* | 8/2016 | Sherman | G01D 13/265 |
| 9,995,606 | B2* | 6/2018 | Miyazawa | B60Q 3/62 |
| 10,584,985 | B2* | 3/2020 | Mouard | G01D 11/28 |
| 11,326,912 | B2* | 5/2022 | Giusti | B60K 35/60 |
| 2014/0130575 | A1 | 5/2014 | Webber et al. | |
| 2020/0023737 | A1* | 1/2020 | Kimura | B60K 35/60 |

OTHER PUBLICATIONS

International Search Report for PCT/JP2021/013542 mailed on May 18, 2021.

* cited by examiner

MAGNET FIXING IMPLEMENT

CROSS-REFERENCE TO RELATED APPLICATIONS

This application is a continuation application of International Application No. PCT/JP2021/013542 filed on Mar. 30, 2021 and designated the U.S., which is based upon and claims priority to Japanese Patent Application No. 2020-066968, filed on Apr. 2, 2020, and Japanese Patent Application No. 2020-102578, filed on Jun. 12, 2020, the entire contents of which are incorporated herein by reference.

BACKGROUND OF THE INVENTION

1. Field of the Invention

The present disclosure relates to magnet fixing implements.

2. Description of the Related Art

Japanese Registered Utility Model No. 3161399 (hereinafter referred to as "Patent Document 1") proposes a magnet fixing implement, attached to a rotation center portion of an indicator needle of a pressure gauge, and configured to hold a magnet for detecting a rotation angle of the indicator needle.

However, because the magnet fixing implement proposed in Patent Document 1 has a cover located above the magnet, it is difficult to reduce a thickness of the magnet fixing implement, and it is not possible to install the magnet fixing implement when a gap between the indicator needle and a transparent plate of the pressure gauge is narrow. Moreover, the magnet fixing implement proposed in Patent Document 1 cannot be installed for general purpose use with respect to indicator needles having various sizes, because the dimensions of each part need to be adapted to the indicator needle having a particular size.

In addition, because the technique proposed in Patent Document 1 requires the provision of a replacement transparent plate having the same external shape as the transparent plate of the pressure gauge, additional costs, such as the cost of components, the cost of molds, or the like, become additionally required for this provision of the replacement transparent plate. Moreover, because the technique proposed in Patent Document 1 requires the provision of the replacement transparent plate according to an outer diameter of a meter, it is not possible to easily adapt to a plurality of kinds of meters having different outer diameters. Further, a conventional method determines a center position of an analog meter, and attaches a magnetic sensor to the center position, but there is a problem in that this method is troublesome to perform.

SUMMARY OF THE INVENTION

According to one aspect of the present disclosure, a magnet fixing implement for fixing a magnet for rotation angle detection, attached to a rotation center portion of an indicator needle of an analog meter, includes a main body; a magnet holder provided on an upper surface of the main body, and configured to hold the magnet at a rotation center of the indicator needle; a slit formed in the main body in a flat shape perpendicular to the rotation center, and configured to accommodate the rotation center portion of the indicator needle; a rotation shaft holder provided below the slit of the main body, and configured to hold a rotation shaft of the indicator needle; and an indicator needle restricting portion protruding toward an outer side from an outer peripheral edge of the main body, and configured to restrict a rotation of the indicator needle with respect to the main body.

According to another aspect of the present disclosure, a positioning device for positioning a sensor unit with respect to a center of a front surface of a generally circular and transparent cover member covering a display surface of an analog meter, includes a pair of clamping members provided to oppose each other in a first direction, and configured to clamp an outer peripheral surface of an outer frame of the cover member; a rack extending in the first direction, and configured to link the pair of clamping members so that a separation distance of the pair of clamping members is adjustable; a center block positioned on a back surface side of the cover member at an intermediate position of the pair of clamping members, regardless of the separation distance of the pair of clamping members; and a positioning member positioned on the front surface side at the intermediate position of the pair of clamping members, regardless of the separation distance of the pair of clamping members, and configured to position the sensor unit with respect to the center of the front surface of the cover member.

Other objects and further features of the present invention will be apparent from the following detailed description when read in conjunction with the accompanying drawings.

DESCRIPTION OF THE PREFERRED EMBODIMENTS

First Embodiment

Hereinafter, a first embodiment will be described with reference to the drawings.

Configuration of Magnet Fixing Implement 100

Figure 1:
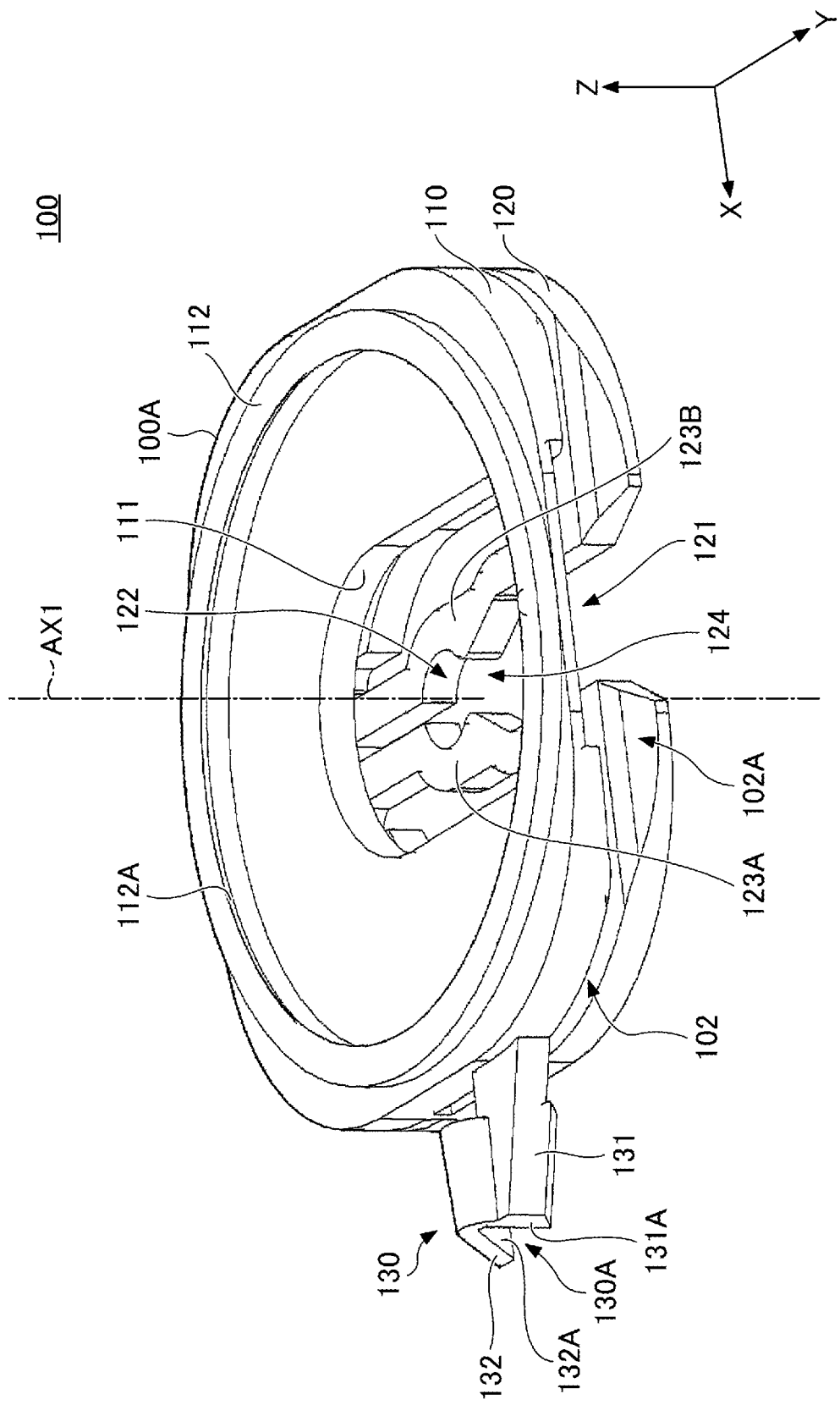
FIG. 1 is a perspective view of an external appearance of a magnet fixing implement according to a first embodiment.
Figure 2:
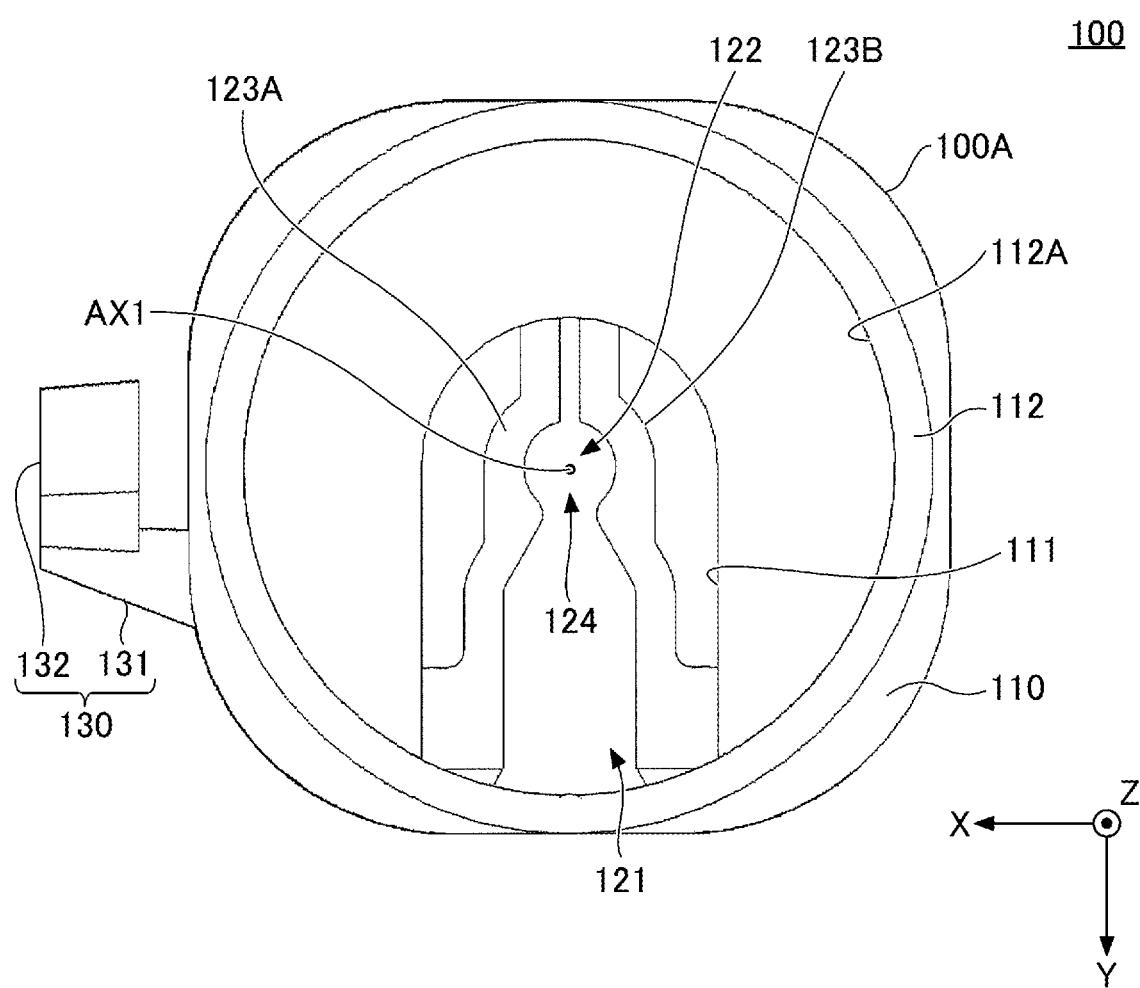
FIG. 2 is a plan view of the magnet fixing implement according to the first embodiment.
Figure 3:
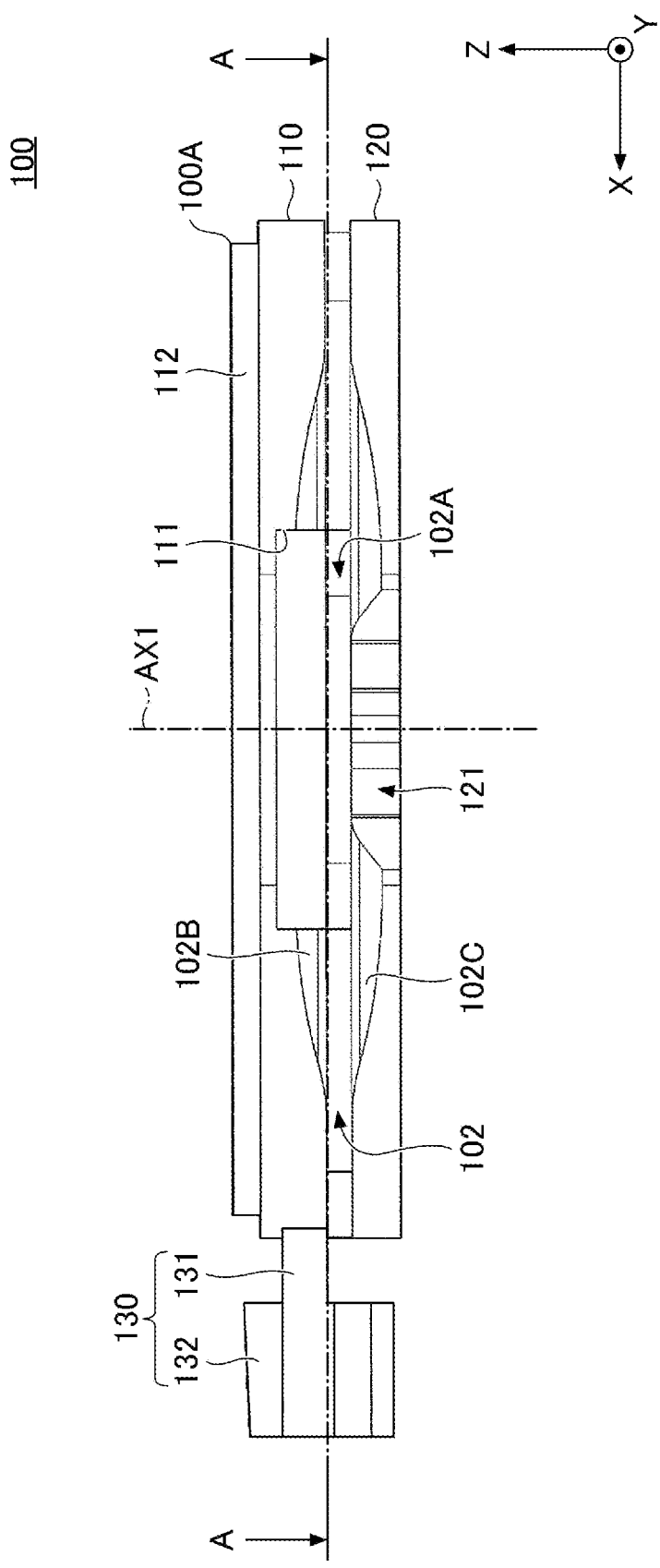
FIG. 3 is a side view of the magnet fixing implement according to the first embodiment.
Figure 4:
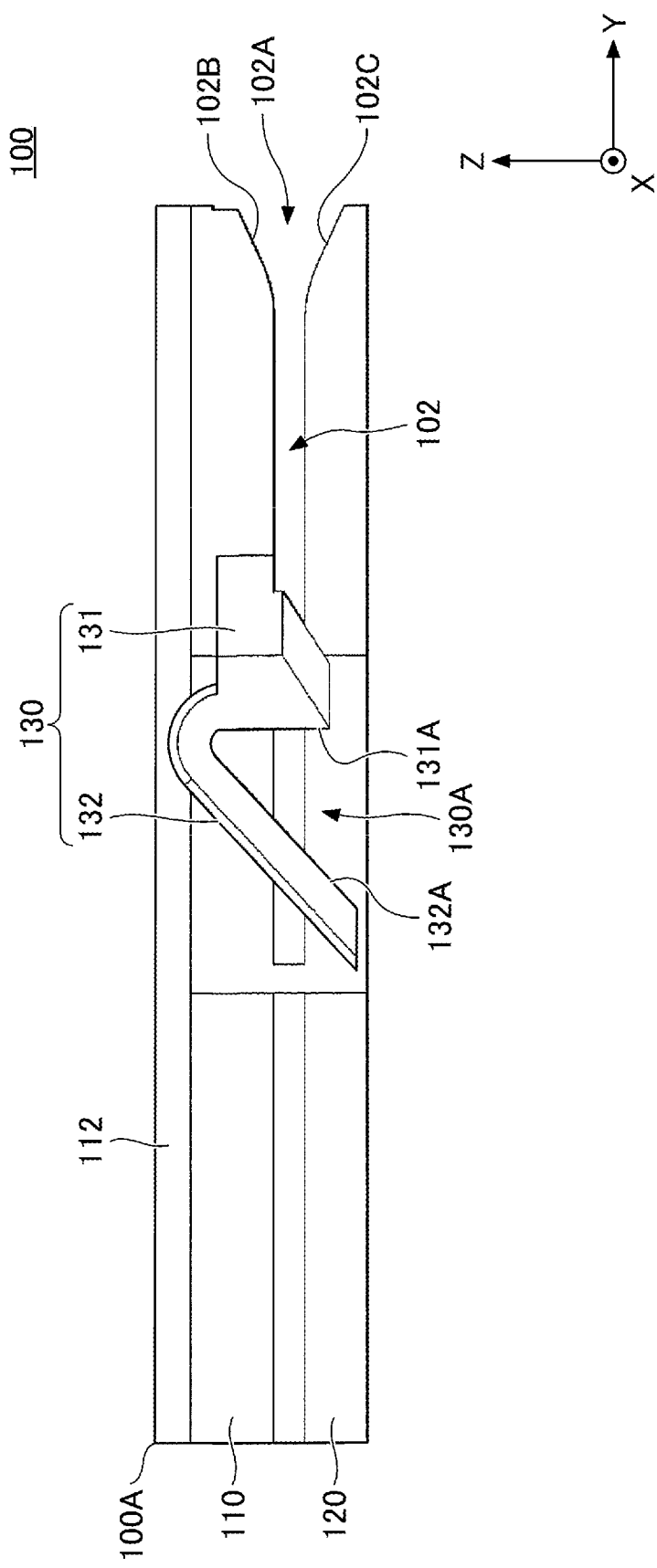
FIG. 4 is a front view of the magnet fixing implement according to the first embodiment.
Figure 5:
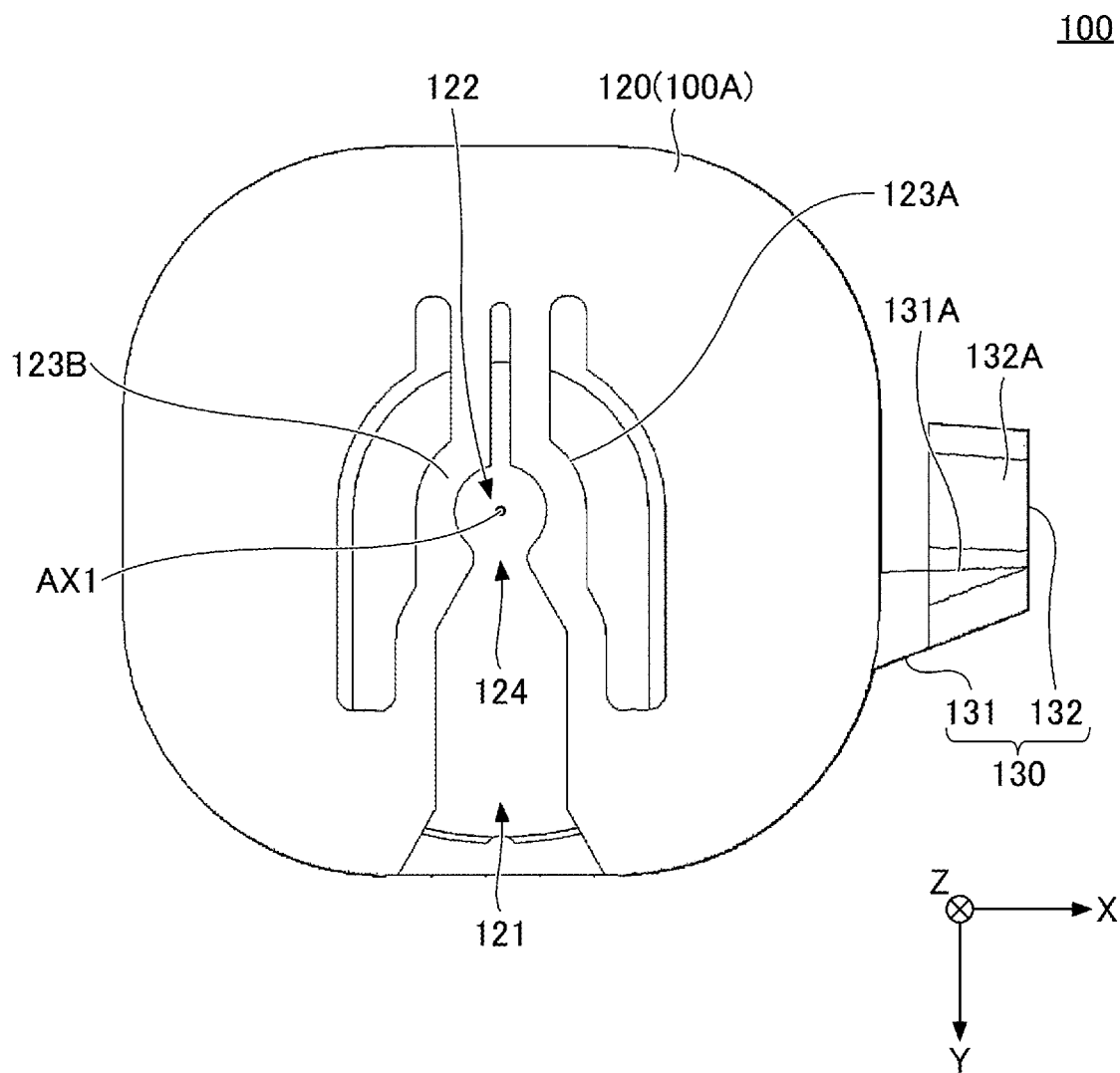
FIG. 5 is a bottom view of the magnet fixing implement according to the first embodiment.
Figure 6:
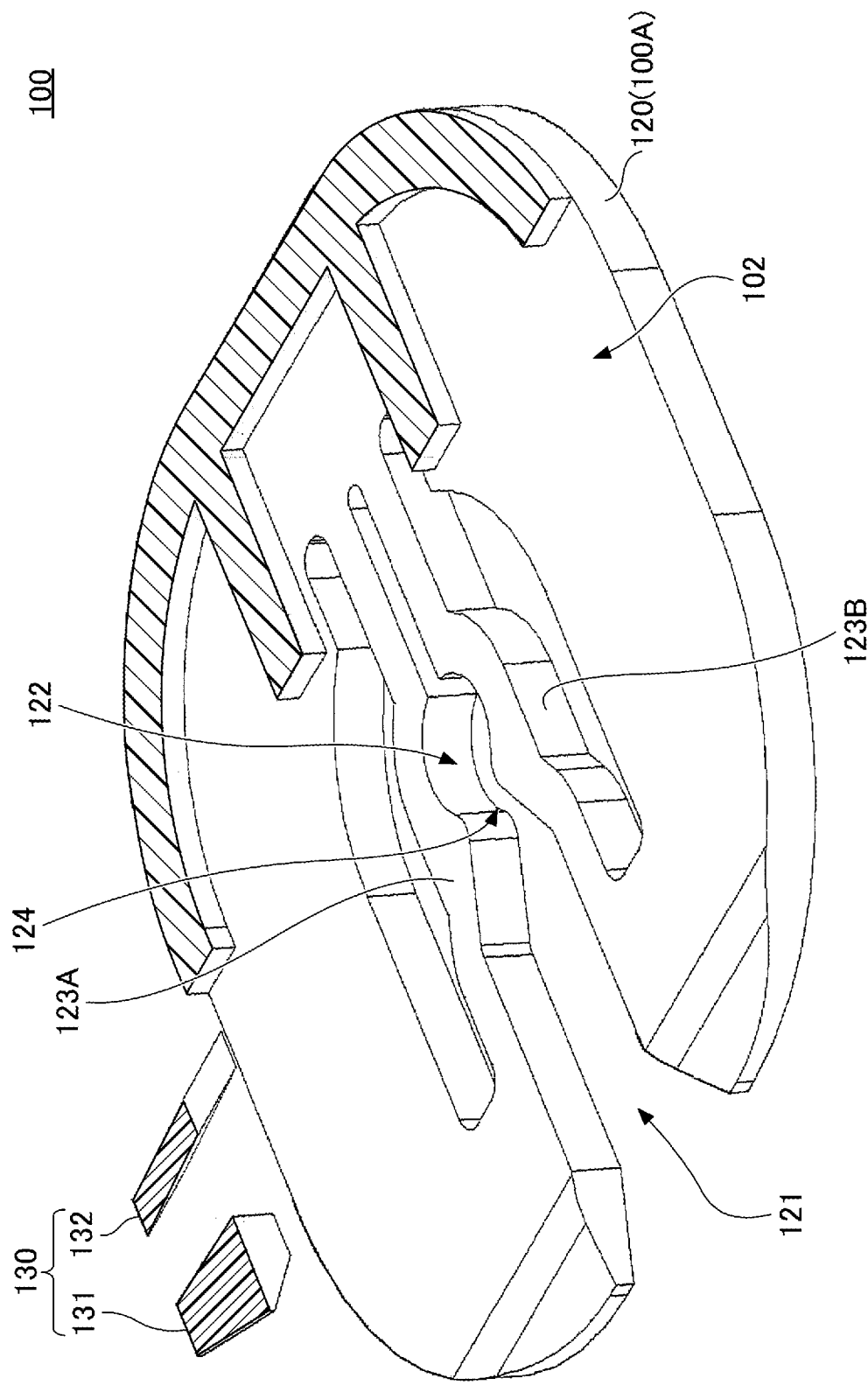
FIG. 6 is a perspective cross sectional view illustrating a cross section of the magnet fixing implement according to the first embodiment along a section line A-A.

FIG. 1 is a perspective view of an external appearance of a magnet fixing implement 100 according to a first embodiment. FIG. 2 is a plan view of the magnet fixing implement 100 according to the first embodiment. FIG. 3 is a side view of the magnet fixing implement 100 according to the first embodiment. FIG. 4 is a front view of the magnet fixing implement 100 according to the first embodiment. FIG. 5 is a bottom view of the magnet fixing implement 100 according to the first embodiment. FIG. 6 is a perspective cross sectional view illustrating a cross section of the magnet fixing implement 100 according to the first embodiment along a section line A-A (refer to FIG. 3).

The magnet fixing implement 100 illustrated in FIG. 1 through FIG. 6 is a member having a relatively thin and generally disk-shaped main body 100A. In order to fix a disk-shaped magnet 20 for detecting a rotation angle (refer to FIG. 7 through FIG. 9), with respect to a rotation center portion 30A (a portion where a rotation shaft 32 is provided) of an indicator needle 30 (refer to FIG. 7 through FIG. 9) of an analog meter, the magnet fixing implement 100 is attached to the rotation center portion 30A of the indicator needle 30. The magnet fixing implement 100 is formed by an injection molding of an elastic resin material, such as a polypropylene (PP) resin or the like, for example. In the following description, for the sake of convenience, a direction along a rotation center AX2 of the rotation shaft 32 is regarded as an up-down direction or a Z-axis direction, a length direction of a long needle portion 36 of the indicator needle 30 is regarded as a front-rear direction or an X-axis direction, and a width direction of the long needle portion 36 of the indicator needle 30 is regarded as a left-right direction or a Y-axis direction.

As illustrated in FIG. 1 through FIG. 6, the main body 100A of the magnet fixing implement 100 is formed with a slit 102 having a constant height range and parallel with respect to an XY-plane, at a center portion along the up-down direction (the Z-axis direction). The slit 102 is a portion that accommodates a portion of the indicator needle 30 centered about the rotation center AX2. The slit 102 has an opening 102A at an end on a positive side of the Y-axis. Hence, it is possible to slide and insert the rotation center portion 30A of the indicator needle 30 into the slit 102 from the opening 102A. A top surface 102B and a bottom surface 102C of the opening 102A have a tapered shape, and are sloped so that the height range of the opening 102A gradually increases toward an outer side (positive side of the Y-axis). Accordingly, the rotation center portion 30A of the indicator needle 30 can easily be inserted into the slit 102 from the opening 102A. The slit 102 is formed in the main body 100A of the magnet fixing implement 100, and an upper wall portion 110 forms an upper side (positive side of the Z-axis) of the slit 102, while a lower wall portion 120 forms a lower side (negative side of the Z-axis) of the slit 102. Each of the upper wall portion 110 and the lower wall portion 120 is parallel with respect to the XY-plane and has a thin plate shape.

In the upper wall portion 110, a cutout upper slide groove 111 extending in the left-right direction (Y-axis direction) is formed with a constant width in the front-rear direction (X-axis direction) from an end on the left side (positive side of the Y-axis) toward a center AX1, at a center portion along the front-rear direction (X-axis direction). The upper slide groove 111 is formed so that a cylindrical portion 34 (refer to FIG. 7 and FIG. 8), projecting upward at the rotation center portion 30A of the indicator needle 30, does not interfere with the upper wall portion 110 when sliding the indicator needle 30 into the slit 102. For this reason, the width of the upper slide groove 111 in the front-rear direction (X-axis direction) is larger than a diameter of the cylindrical portion 34.

In addition, an annular magnet holder 112 having a constant height is formed on an upper surface of the upper wall portion 110. The magnet holder 112 is a portion for holding the disk-shaped magnet 20 on an inner side thereof. The height of the magnet holder 112 from the upper surface of the upper wall portion 110 is approximately the same size as a thickness of the magnet 20, and an inner diameter of the magnet holder 112 is approximately the same size as an outer diameter of the magnet 20. Thus, the magnet holder 112 has a minimum required size, and contributes to size reduction of the main body 100A. An inner peripheral edge 112A (that is, an upper opening) at an upper end of the magnet holder 112 has an inner diameter slightly smaller than a maximum outer diameter of the magnet 20. For this reason, the magnet 20 can be pushed into the magnet holder 112 from above, to fit the magnet 20 in the magnet holder 112 while pressing and spreading the inner peripheral edge 112A. Further, the magnet holder 112 can hold the magnet 20, so that the inner peripheral edge 112A prevents the magnet 20 from easily falling off.

In the lower wall portion 120, a cutout guide 121 extending in the left-right direction (Y-axis direction) is formed from an end on the left side (positive side of the Y-axis) toward the center AX1, at the center portion along the front-rear direction (X-axis direction). The guide 121 is formed to prevent the rotation shaft 32 (refer to FIG. 7) of the indicator needle 30 from interfering with the lower wall portion 120 and to guide the rotation shaft 32 to the rotation shaft holder 122, when sliding the indicator needle 30 into the slit 102. For this reason, a width of the guide 121 in the front-rear direction (X-axis direction) is larger than a diameter of the rotation shaft 32 excluding the rotation shaft holder 122 and a rotation shaft restricting portion 124.

The rotation shaft holder 122 for holding the rotation shaft 32 that is disposed to project downward at the rotation center portion 30A of the indicator needle 30, is formed at the center AX1 of the guide 121. The rotation shaft holder 122 has a circular shape in a plan view viewed from above. The inner diameter of the rotation shaft holder 122 is smaller than the diameter of the rotation shaft 32.

The rotation shaft restricting portion 124 for restricting the rotation shaft 32 from falling off the rotation shaft holder 122, is formed at an entrance of the rotation shaft holder 122 of the guide 121. A width of the rotation shaft restricting portion 124 is smaller than the diameter of the rotation shaft 32, and is also smaller than the diameter of the rotation shaft holder 122.

In this case, the guide 121 is a space sandwiched between a first elastic beam 123A provided on the front side (positive side of the X-axis) of the guide 121, and a second elastic beam 123B provided on the rear side (negative side of the X-axis) of the guide 121. That is, a wall surface on the front side (positive side of the X-axis) of the guide 121 is formed on the first elastic beam 123A, and a wall surface on the rear side (negative side of the X-axis) of the guide 121 is formed on the second elastic beam 123B.

The first elastic beam 123A and the second elastic beam 123B are elastically deformable in the front-rear direction (X-axis direction), and both ends thereof in the left-right direction (Y-axis direction) are supported by the lower wall portion 120.

Accordingly, when the rotation shaft 32 is caused to slide inside the guide 121 toward the rotation shaft holder 122, the magnet fixing implement 100 according to the first embodiment can fit the rotation shaft 32 into the rotation shaft holder 122 while pressing and spreading the rotation shaft restricting portion 124 by the rotation shaft 32.

In this state, the magnet fixing implement 100 according to the first embodiment can press and spread the rotation shaft holder 122 by the rotation shaft 32, and adjust the size according to the diameter of the rotation shaft 32. Hence, the magnet fixing implement 100 according to the first embodiment can positively hold the rotation shaft 32 by the rotation shaft holder 122, without generating play between the rotation shaft holder 122 and the rotation shaft 32.

In addition, the rotation shaft holder 122 can hold the rotation shaft 32 in correspondence with various diameters of the rotation shaft 32, because the diameter thereof about the center AX1 is variable due to the elastic deformation of the first elastic beam 123A and the second elastic beam 123B.

Further, the magnet fixing implement 100 according to the first embodiment can prevent the rotation shaft 32 held by the rotation shaft holder 122 from easily falling out from the rotation shaft holder 122, by the rotation shaft restricting portion 124 provided at the entrance of the rotation shaft holder 122.

Both the center of the rotation shaft holder 122 and the center of the magnet holder 112 coincide with the center AX1 of the magnet fixing implement 100. Moreover, the center of the rotation shaft holder 122 coincides with a rotation center AX2 of the rotation shaft 32, regardless of the diameter of the rotation shaft 32. For this reason, the magnet fixing implement 100 according to the first embodiment can align the rotation center AX2 of the rotation shaft 32 to coincide with the center AX1 of the magnet fixing implement 100, that is, the center of the magnet 20, regardless of the diameter of the rotation shaft 32. Accordingly, the magnet fixing implement 100 according to the first embodiment can reduce axial runout of the magnet 20 caused by the rotation of the rotation shaft 32.

In addition, the magnet fixing implement 100 protrudes to the outer side (X-axis direction) from the outer peripheral edge of the main body 100A (upper wall portion 110), and is provided with an indicator needle restricting portion 130 that restricts the rotation of the indicator needle 30 with respect to the main body 100A (upper wall portion 110).

More particularly, the indicator needle restricting portion 130 includes a protrusion 131 protruding frontward (positive direction of the X-axis) that is a longitudinal direction of the long needle portion 36 of the indicator needle 30, from the outer peripheral edge of the front side (positive side of the X-axis) of the upper wall portion 110, and a tongue 132 extending rightward (negative direction of the Y-axis) that is a width direction of the long needle portion 36 of the indicator needle 30, from an upper surface of the protrusion 131. The tongue 132 is elastically deformable in a direction (Z-axis direction) parallel to the rotation center AX2, and can press down on the long needle portion 36 of the indicator needle 30 disposed below the tongue 132 from above the long needle portion 36.

In addition, the tongue 132 is provided with an inclination from the protrusion 131, so that a gap 130A between the tongue 132 and the protrusion 131 gradually widens toward a downward direction (negative direction of the Z-axis). Thus, the indicator needle restricting portion 130 can hold both ends in the width direction of the long needle portion 36 of the indicator needle 30 disposed in the gap 130A, by a first contact surface 131A of the protrusion exposed at the gap 130A, and a second contact surface 132A of the tongue 132 exposed at the gap 130A.

Configuration of Structure 10

Figure 7:
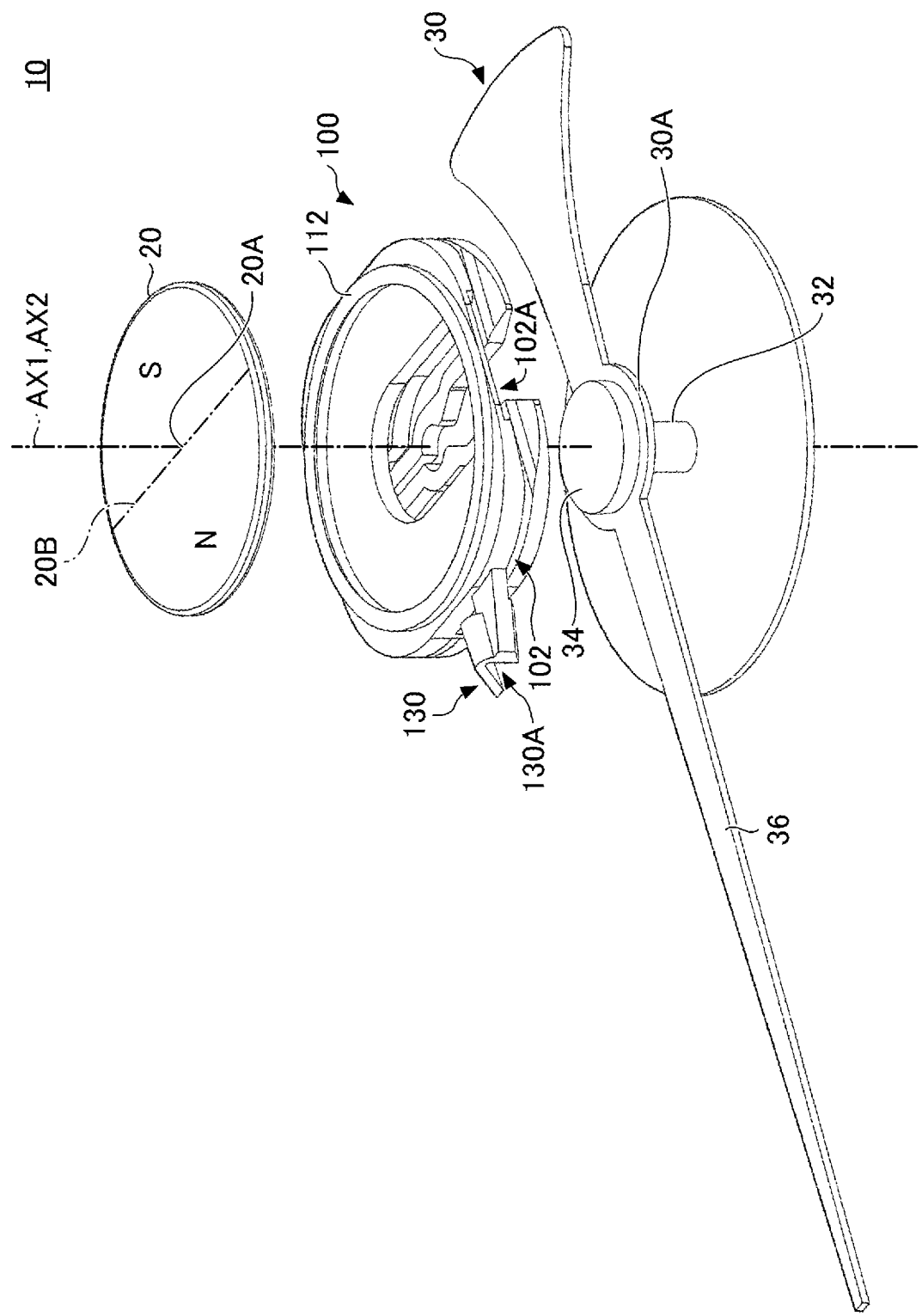
FIG. 7 is a disassembled perspective view of a structure according to the first embodiment.

FIG. 7 is a disassembled perspective view of a structure 10 according to the first embodiment. As illustrated in FIG. 7, the structure 10 according to the first embodiment includes the magnet fixing implement 100, the magnet 20, and the indicator needle 30. The magnet fixing implement 100 is attached to the indicator needle 30, by inserting the indicator needle 30 into the slit 102 so that the center AX1 of the magnet fixing implement 100 coincides with the rotation center AX2 of the rotation shaft 32 of the indicator needle 30.

The magnet 20 is attached to the magnet holder 112 of the magnet fixing implement 100, in order to detect the rotation angle of the indicator needle 30. By attaching the magnet 20 to the magnet holder 112, a center 20A of the magnet 20 coincides with the center AX1 of the magnet fixing implement 100. The magnet 20 has a thin disk shape. In the plan view, the magnet 20 is magnetized to the N pole and the S pole on respective sides of a boundary line 20B passing through the center 20A of the magnet 20.

Method of Assembling Structure 10

Figure 8:
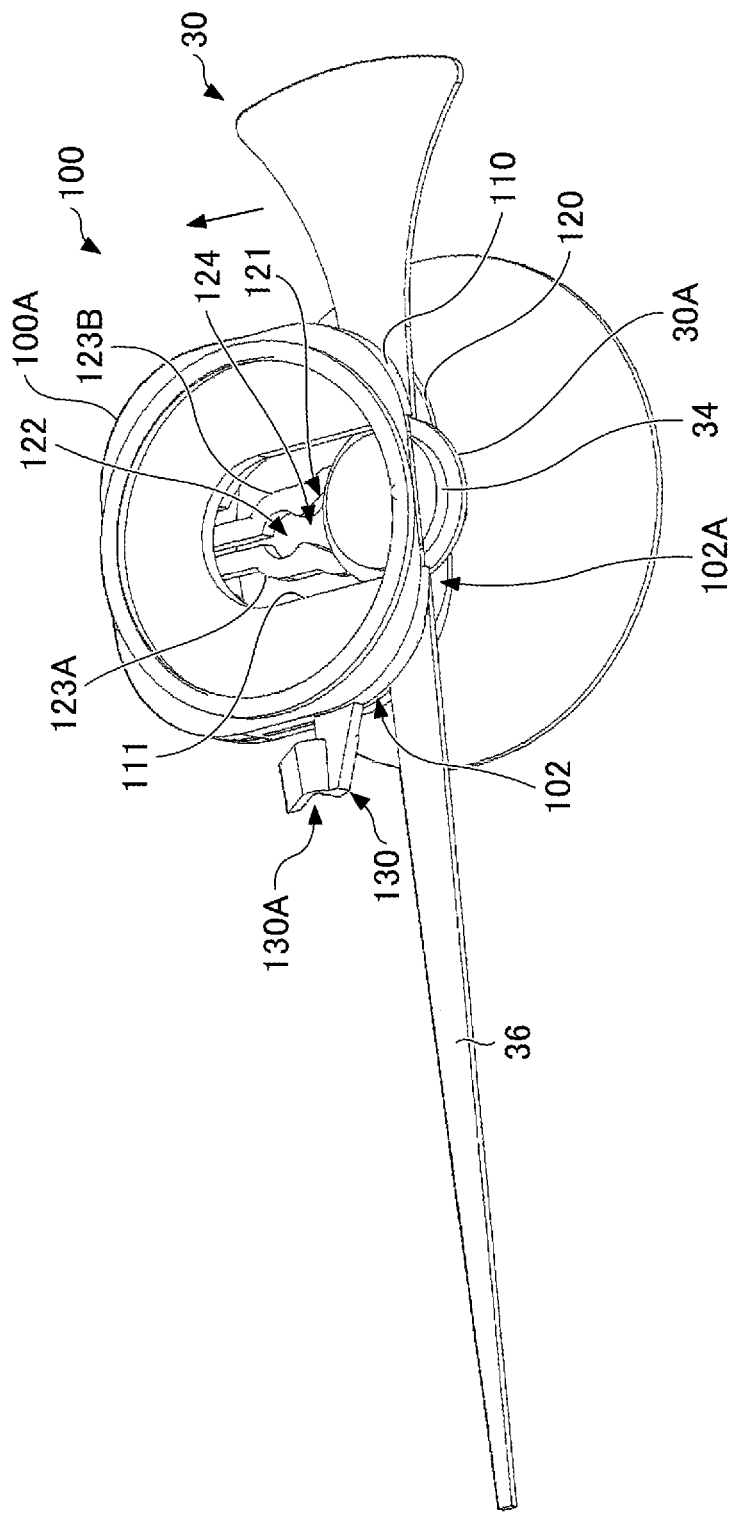
FIG. 8 is a diagram for explaining a method of attaching the magnet fixing implement according to the first embodiment.
Figure 9:
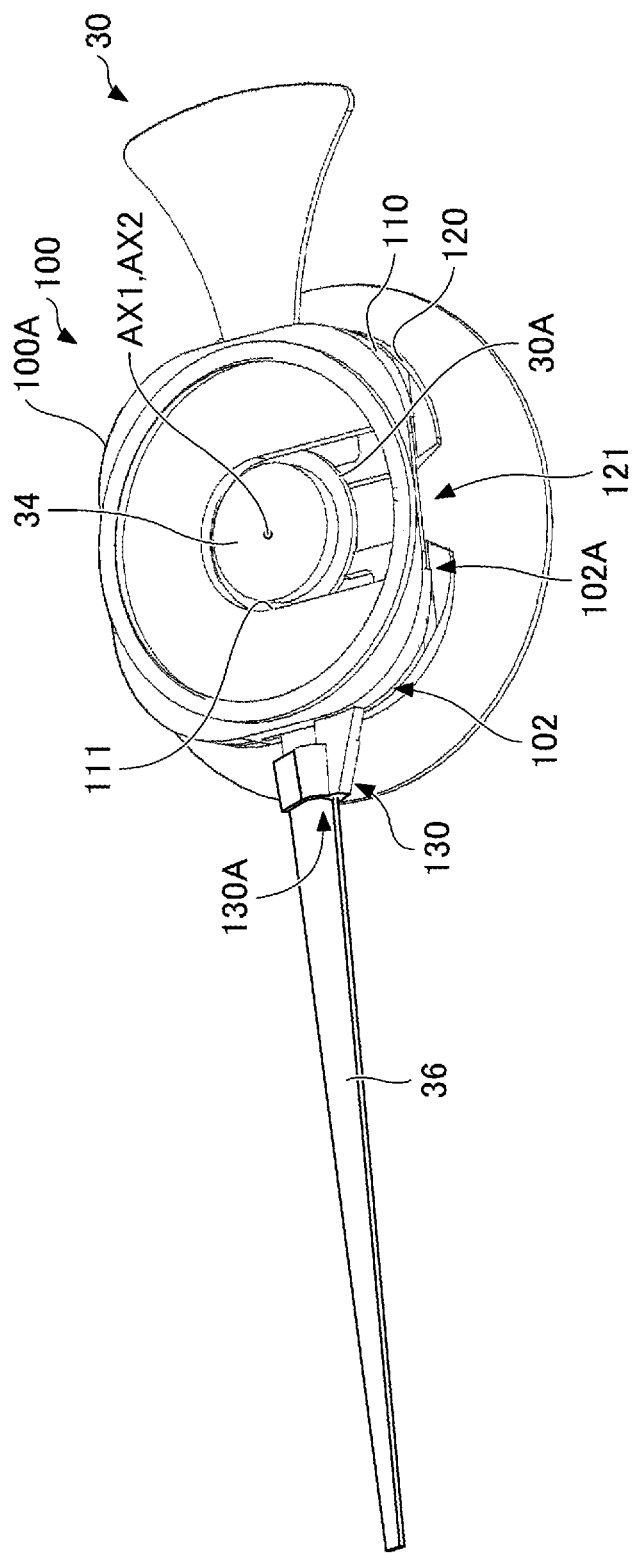
FIG. 9 is a diagram for explaining the method of attaching the magnet fixing implement according to the first embodiment.
Figure 10:
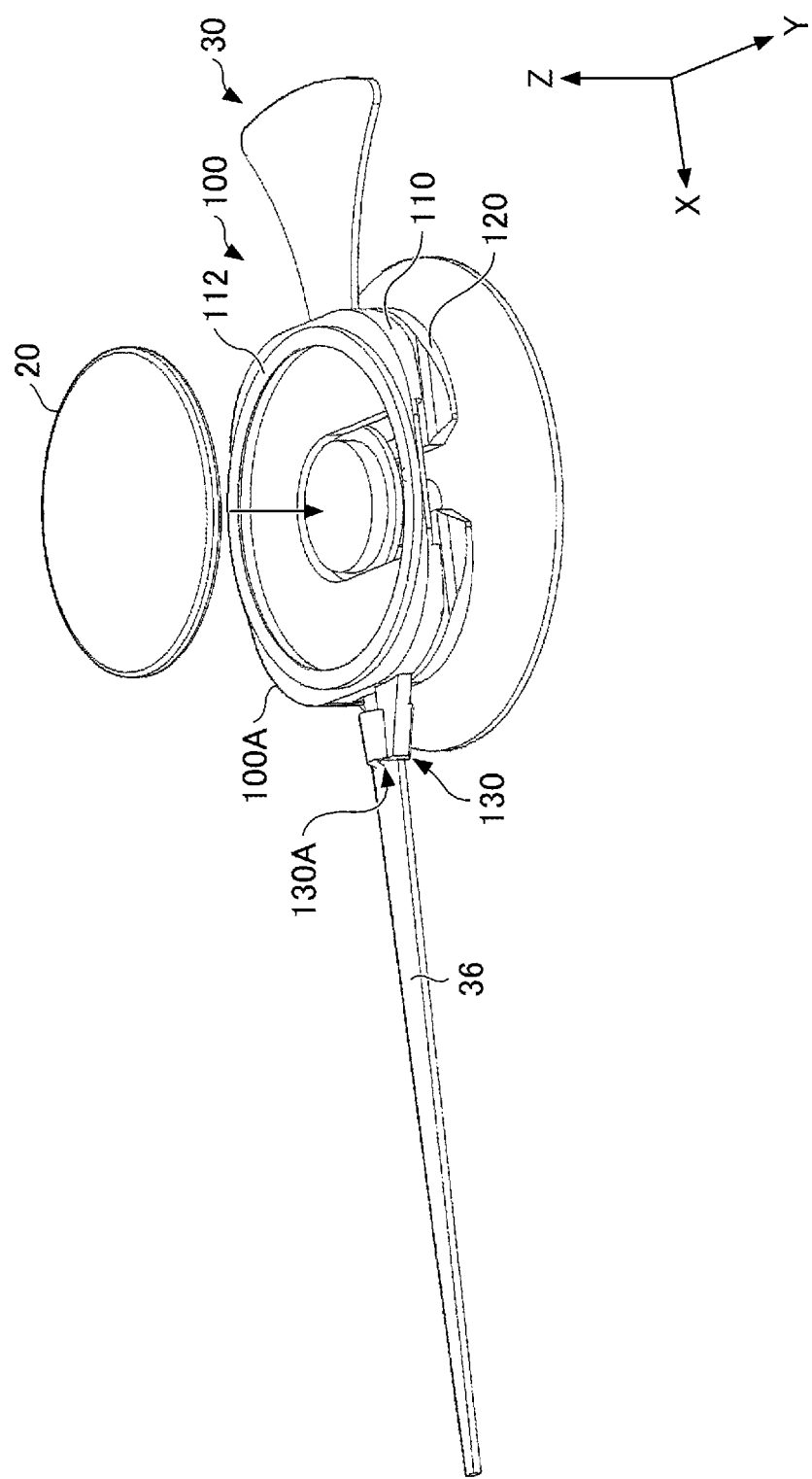
FIG. 10 is a diagram for explaining a method of attaching a magnet according to the first embodiment.
Figure 11:
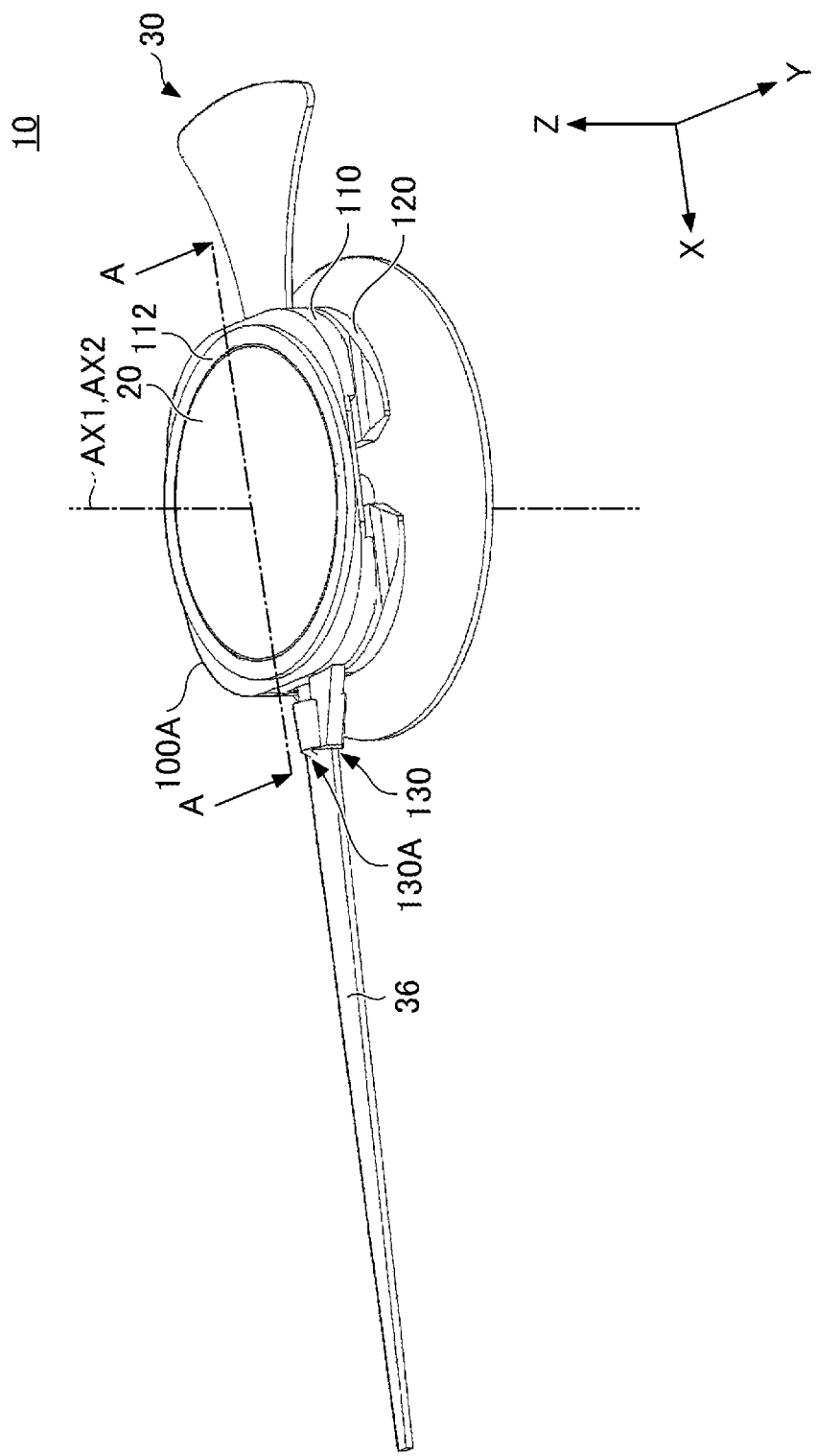
FIG. 11 is a diagram for explaining the method of attaching the magnet according to the first embodiment.
Figure 12:
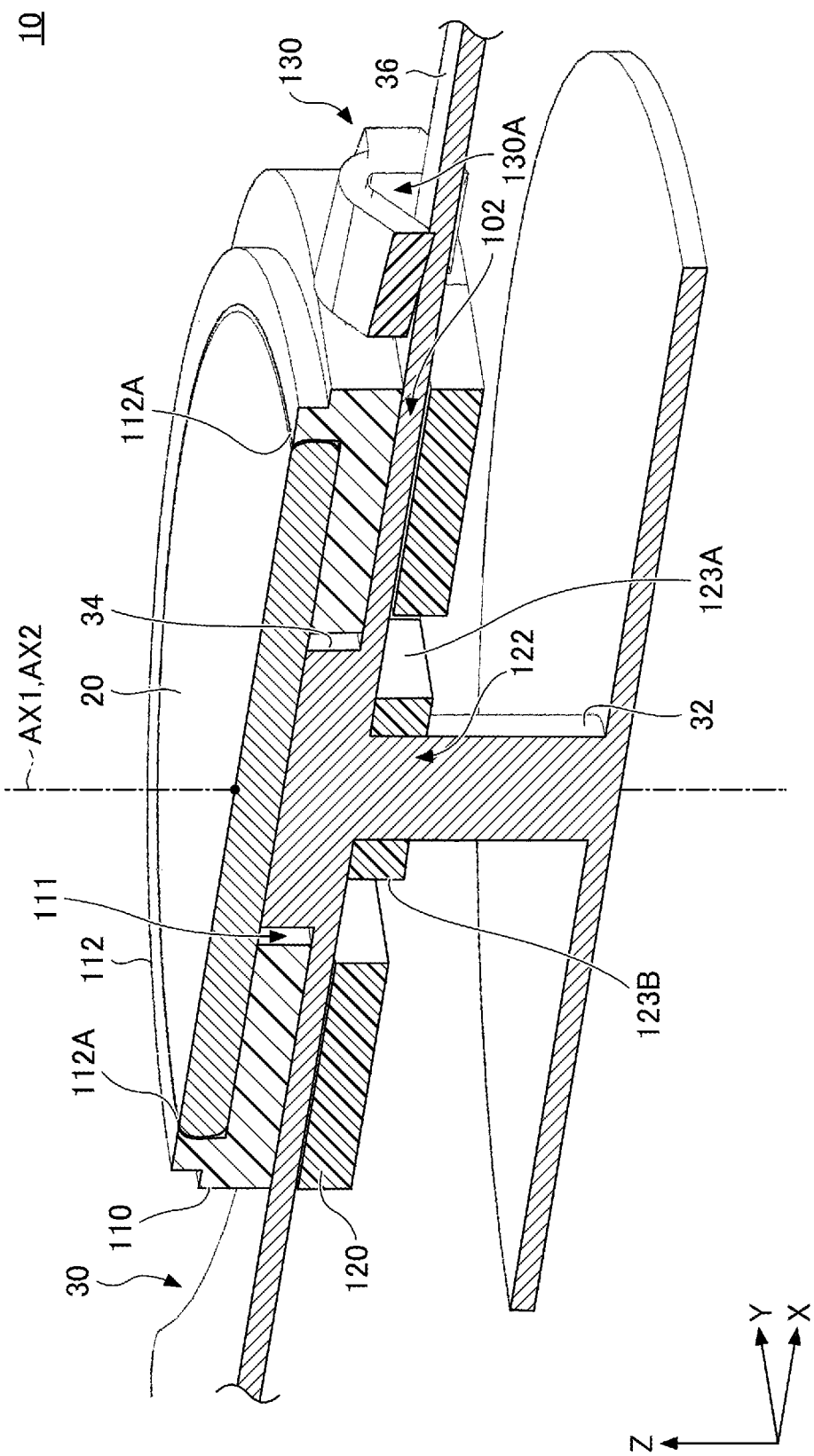
FIG. 12 is a cross sectional view of the structure illustrated in FIG. 11 along a line A-A.

Next, a method of assembling the structure 10 according to the first embodiment will be described, with reference to FIG. 8 through FIG. 12. FIG. 8 and FIG. 9 are diagrams for explaining a method of attaching the magnet fixing implement 100 according to the first embodiment. FIG. 10 and FIG. 11 are diagrams for explaining a method of attaching the magnet 20 according to the first embodiment. FIG. 12 is a cross sectional view of the structure 10 illustrated in FIG. 11 along a line A-A.

First, as illustrated in FIG. 8, the rotation center portion 30A of the indicator needle 30 is inserted into the slit 102 from the opening 102A formed on the magnet fixing implement 100 on the positive side of the Y-axis, and caused to slide inside the slit 102 in the negative direction of the Y-axis. In this state, the rotation shaft 32 of the indicator needle 30 is caused to slide in the negative direction of the Y-axis inside the guide 121 between the first elastic beam 123A and the second elastic beam 123B. Moreover, in this case, the cylindrical portion 34 of the indicator needle 30 is caused to slide in the negative direction of the Y-axis inside the upper slide groove 111 formed in the upper wall portion 110.

Further, when the rotation shaft 32 of the indicator needle 30 abuts the rotation shaft restricting portion 124 having a width narrower than the rotation shaft 32 inside the guide 121, the rotation center portion 30A of the indicator needle 30 is pressed further in the negative direction of the Y-axis. Hence, the rotation shaft 32 of the indicator needle 30 can be fitted into the rotation shaft holder 122 while pressing and spreading the rotation shaft restricting portion 124 by the rotation shaft 32 of the indicator needle 30.

As a result, as illustrated in FIG. 9, the magnet fixing implement 100 is attached to the indicator needle 30 so that the center AX1 of the magnet fixing implement 100 coincides with the rotation center AX2 of the rotation shaft 32 of the indicator needle 30.

In addition, by performing the operation of fitting the rotation shaft 32 into the rotation shaft holder 122, it is possible to simultaneously perform an operation of fitting the indicator needle 30 that will be described later. Hence, as illustrated in FIG. 9, the long needle portion 36 of the indicator needle 30 is fitted into the gap 130A of the indicator needle restricting portion 130 projecting frontward (positive direction of the X-axis) from the main body 100A of the magnet fixing implement 100. As a result, the rotation of the indicator needle 30 with respect to the main body 100A of the magnet fixing implement 100 is restricted.

Moreover, as illustrated in FIG. 10 and FIG. 11, the magnet 20 for rotation angle detection is fitted into the magnet holder 112 of the magnet fixing implement 100. Thus, as illustrated in FIG. 11, in the magnet fixing implement 100, the magnet 20 is attached to the magnet holder 112, so that the center AX1 of the magnet fixing implement 100, the rotation center AX2 of the rotation shaft 32 of the indicator needle 30, and the center of the magnet 20 for rotation angle detection coincide with one another.

Although the magnet 20 for rotation angle detection is fitted into the magnet holder 112 of the magnet fixing implement 100 after the operation of fitting the rotation shaft 32 of the indicator needle 30 into the rotation shaft holder 122 in the example described above, an operation sequence may fit the magnet 20 for rotation angle detection into the magnet holder 112 of the magnet fixing implement 100 before the operation of fitting the rotation shaft 32 of the indicator needle 30 into the rotation shaft holder 122.

As illustrated in FIG. 12, the height of the magnet holder 112 is approximately the same size as the thickness of the magnet 20, and the inner diameter of the magnet holder 112 is approximately the same size as the outer diameter of the magnet 20. Hence, the magnet holder 112 has the minimum required size, and contributes to size reduction of the main body 100A.

Further, as illustrated in FIG. 12, the inner peripheral edge 112A (that is, the upper opening) at the upper end of the magnet holder 112 has the inner diameter slightly smaller than the maximum outer diameter of the magnet 20. For this reason, the magnet 20 can be pushed into the magnet holder 112 from above, to fit the magnet 20 in the magnet holder 112 while pressing and spreading the inner peripheral edge 112A. In addition, the magnet holder 112 can hold the magnet 20, so that the inner peripheral edge 112A prevents the magnet 20 from easily falling off. More particularly, because the inner peripheral edge 112A is shaped to hold a curved rim of an outer periphery of the magnet 20, the magnet holder 112 does not require a cover for covering the magnet 20, and thus, the height of the magnet holder 112 is the same as the thickness of the magnet 20. Accordingly, both the thickness and the size of the magnet fixing implement 100 according to the first embodiment can be made small. For example, in the present embodiment, the thickness of the magnet 20 is 1 mm, and the diameter of the magnet 20 is 20 mm. On the other hand, the thickness of the magnet fixing implement 100 is approximately 3 mm, and the length of one side of the magnet fixing implement 100 is approximately 23 mm.

Various magnets 20 having different diameters and thicknesses can be attached to the magnet fixing implement 100 according to the first embodiment, by varying the shape of the magnet holder 112.

Operation of Fitting Long Needle Portion 36 of Indicator Needle 30

Figure 13:
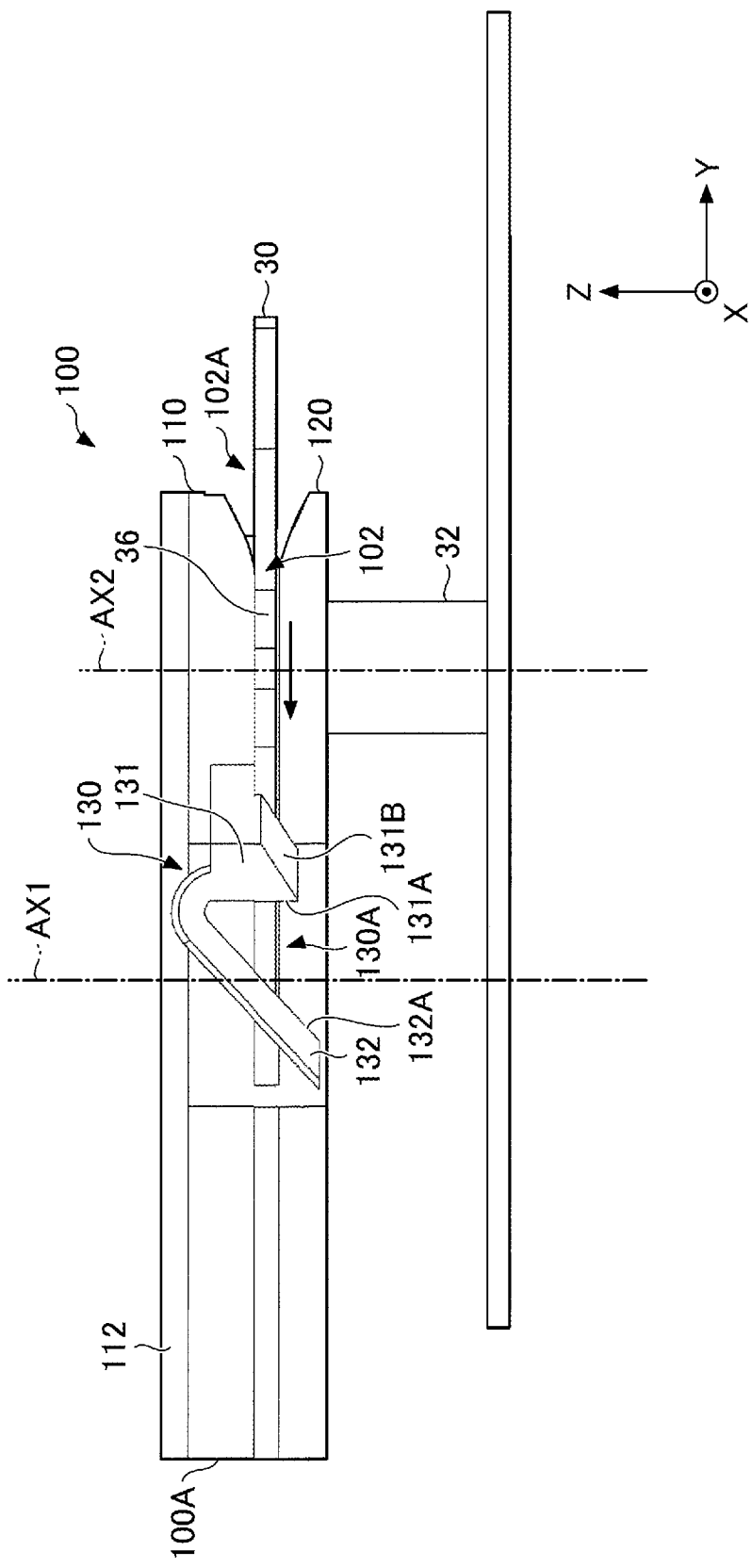
FIG. 13 is a diagram for explaining an operation of fitting a long needle of an indicator needle with respect to the magnet fixing implement according to the first embodiment.
Figure 14:
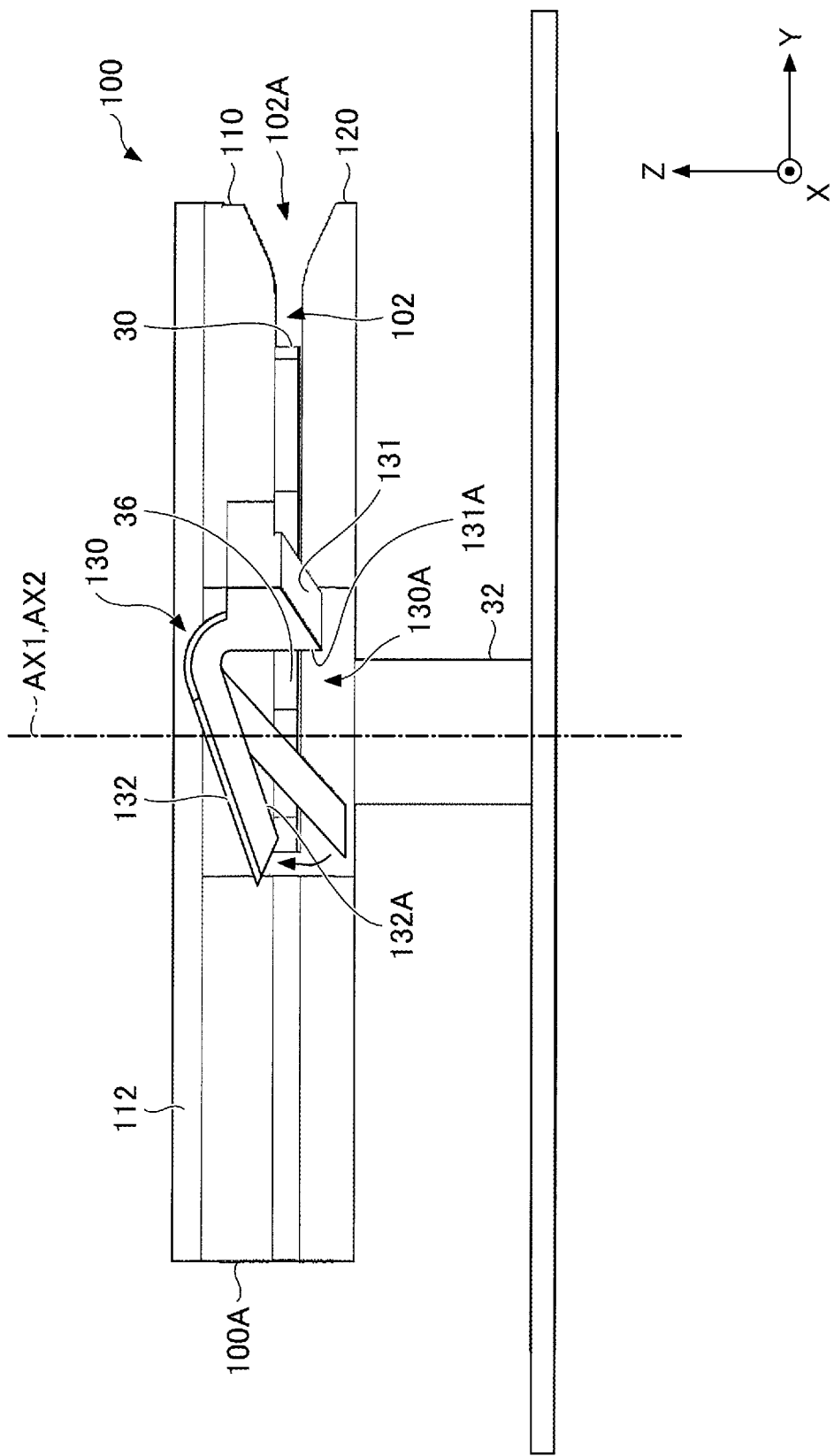
FIG. 14 is a diagram for explaining the operation of fitting the long needle of the indicator needle with respect to the magnet fixing implement according to the first embodiment.

FIG. 13 and FIG. 14 are diagrams for explaining an operation of fitting the long needle portion 36 of the indicator needle 30 with respect to the magnet fixing implement 100 according to the first embodiment.

As illustrated in FIG. 13, when an operation is performed to slide the rotation center portion 30A of the indicator needle 30 inside the slit 102 in the negative direction of the Y-axis, and fit the rotation shaft 32 of the indicator needle 30 into the rotation shaft holder 122, the long needle portion 36 of the indicator needle 30 abuts an inclined bottom surface 131B of the protrusion 131 of the indicator needle restricting portion 130 provided to protrude frontward (positive direction of the X-axis) from the main body 100A of the magnet fixing implement 100.

In this state, when the rotation center portion 30A of the indicator needle 30 is caused to further slide inside the slit 102 in the negative direction of the Y-axis, the long needle portion 36 of the indicator needle 30 moves in the negative direction of the Y-axis while being elastically deformed along the bottom surface 131B.

Then, when the long needle portion 36 of the indicator needle 30 rides over the bottom surface 131B, the long needle portion 36 of the indicator needle 30 pushes the tongue 132 of the indicator needle restricting portion 130 upward, and becomes disposed in the gap 130A between the tongue 132 and the protrusion 131, as illustrated in FIG. 14.

Accordingly, as illustrated in FIG. 14, both ends in the width direction (Y-axis direction) of the long needle portion 36 of the indicator needle 30 are held by the first contact surface 131A of the protrusion 131 exposed at the gap 130A, and the second contact surface 132A of the tongue 132 exposed at the gap 130A.

Because the width and height position of the gap 130A are variable due to the elastic deformation of the tongue 132, the indicator needle restricting portion 130 can hold both ends in the width direction of the long needle portion 36 in correspondence with the various widths and thicknesses of the long needle portion 36.

Example of Configuration of Rotation Angle Detection System 200

Figure 15:
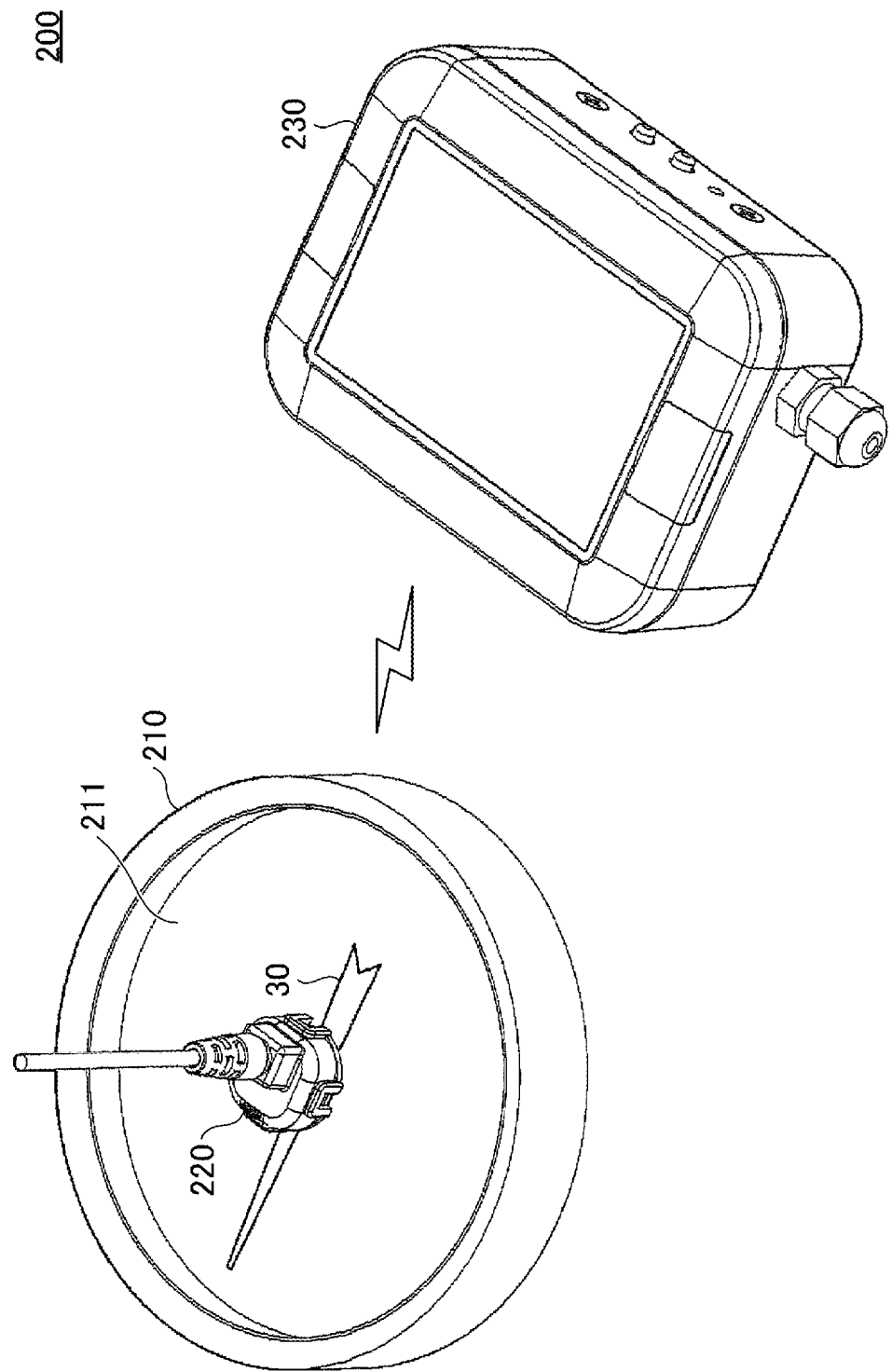
FIG. 15 is a diagram illustrating an example of a configuration of a rotation angle detection system according to the first embodiment.

FIG. 15 is a diagram illustrating an example of a configuration of a rotation angle detection system 200 according to the first embodiment. As illustrated in FIG. 15, the rotation angle detection system 200 includes an analog meter 210, a rotation angle detection device 220, and a rotation angle transmitter 230.

The analog meter 210 includes the indicator needle 30, and a glass lid 211. The magnet fixing implement 100 described in the embodiment is attached to the indicator needle 30 of the analog meter 210. The analog meter 210 is a water meter, a power meter, a gas meter, or the like, for example.

The rotation angle detection device 220 is attached to a center (that is, the rotation center AX2 of the indicator needle 30) of a surface of the glass lid 211. The rotation angle detection device 220 magnetically detects a rotation angle of the indicator needle 30, using a rotation angle detecting sensor (not illustrated) disposed at a position opposing the magnet 20 attached to the magnet fixing implement 100. In addition, the rotation angle detection device 220 transmits a rotation angle detection signal indicating the detected rotation angle to the rotation angle transmitter 230, via a cable or wireless communication (for example, BLUETOOTH™ wireless communication). For example, the rotation angle detection device 220 successively detects the rotation angle of the indicator needle 30 at predetermined time intervals (for example, n second intervals), and successively transmits the rotation angle detection signal to the rotation angle transmitter 230 at predetermined time intervals (for example, n second intervals).

The rotation angle transmitter 230 receives the rotation angle detection signal transmitted from the rotation angle detection device 220, and performs a predetermined process (for example, monitoring display, abnormal detection, recording, data transmission to other devices, or the like), using the rotation angle of the indicator needle 30 indicated by the rotation angle detection signal. For example, the rotation angle transmitter 230 transmits the rotation angle detection signal indicating the detected rotation angle to a gateway or cloud, via wireless communication (for example, BLUETOOTH™ wireless communication, SIGFOX™ wireless communication).

In addition, the rotation angle detection device 220 may be supplied with power from a battery of the rotation angle transmitter 230 via a cable, for example. In this case, a configuration associated with the rotation angle detecting sensor of the rotation angle detection device 220 can be minimized, and the rotation angle detection device 220 can be configured to have a small size.

As described above, the magnet fixing implement 100 according to the first embodiment, that is, the magnet fixing implement 100 for fixing the disk-shaped magnet 20 for detecting the rotation angle, attached to the rotation center portion 30A of the indicator needle 30 of the analog meter, includes the main body 100A, the magnet holder 112 provided on the upper surface of the main body 100A and configured to hold the magnet 20 on the rotation center AX2 of the indicator needle 30 in a state perpendicular to the rotation center AX2, the slit 102 formed in the main body 100A in a flat shape perpendicular to the rotation center AX2 and configured to accommodate the rotation center portion 30A of the indicator needle 30, the rotation shaft holder 122 provided below the slit 102 of the main body 100A and configured to hold the rotation shaft 32 of the indicator needle 30, and the indicator needle restricting portion 130 protruding toward the outer side from the outer peripheral edge of the main body 100A and configured to restrict the rotation of the indicator needle 30 with respect to the main body 100A.

Thus, the magnet fixing implement 100 according to the first embodiment can fix the magnet 20 to the rotation center portion 30A of the indicator needle 30, in a state where the center of the magnet 20 coincides with the rotation center AX2 of the indicator needle 30, by simply attaching the magnet 20 to the rotation center portion 30A of the indicator needle 30, with respect to the various indicator needles 30 having the rotation shafts 32 with different diameters or the like. Further, because the magnet 20 is held on the upper surface of the main body 100A, the magnet fixing implement 100 according to the first embodiment does not require a cover for covering the upper surface of the magnet 20, and the main body 100A can be made thin. Hence, the magnet fixing implement 100 according to the first embodiment can provide the thin magnet fixing implement 100 for general purpose use, capable of easily and positively fix the magnet 20 to the rotation center portion 30A of the indicator needle 30 in a state where the center of the magnet 20 coincides with the rotation center AX2 of the indicator needle 30.

In addition, in the magnet fixing implement 100 according to the first embodiment, the main body 100A includes the first elastic beam 123A and the second elastic beam 123B disposed below the slit 102 and opposing each other, the rotation shaft holder 122 is provided between the first elastic beam 123A and the second elastic beam 123B, and the rotation shaft 32 is held by sandwiching the rotation shaft 32 between the first elastic beam 123A and the second elastic beam 123B.

Hence, the magnet fixing implement 100 according to the first embodiment can align the center of the magnet 20 to coincide with the rotation center AX2 of the indicator needle 30, by simply holding the rotation shaft 32 by the rotation shaft holder 122, regardless of the diameter of the rotation shaft 32.

Moreover, in the magnet fixing implement 100 according to the first embodiment, the main body 100A includes the guide 121 extending between the first elastic beam 123A and the second elastic beam 123B so that the width thereof gradually decreases from the outer peripheral edge of the main body 100A toward the rotation shaft holder 122, and configured to guide the rotation shaft 32 to the rotation shaft holder 122.

Accordingly, the magnet fixing implement 100 according to the first embodiment can easily and positively attach the rotation shaft 32 with respect to the rotation shaft holder 122.

Further, in the magnet fixing implement 100 according to the first embodiment, the indicator needle restricting portion 130 includes the protrusion 131 protruding from the outer peripheral edge of the main body 100A in the longitudinal direction of the indicator needle 30, and the tongue 132 extending from the protrusion 131 in the width direction of the indicator needle 30, elastically deformable in the direction parallel to the rotation center AX2, and configured to press down on the indicator needle 30.

Thus, because the tongue 132 is elastically deformable, the magnet fixing implement 100 according to the first embodiment can adjust the height position of the tongue 132 that presses down on the indicator needle 30, according to the various thicknesses of the indicator needle 30.

In addition, in the magnet fixing implement 100 according to the first embodiment, the tongue 132 is provided with the inclination from the protrusion 131, so that the gap 130A between the tongue 132 and the protrusion 131 gradually widens in the direction parallel to the rotation center AX2, and the indicator needle restricting portion 130 holds both ends in the width direction of the indicator needle 30 disposed in the gap 130A, by the first contact surface 131A of the protrusion 131 exposed at the gap 130A and the second contact surface 132A of the tongue 132 exposed at the gap 130A.

Accordingly, by the elastic deformation of the tongue 132, the magnet fixing implement 100 according to the first embodiment can hold both ends of the indicator needle 30, by adjusting the width of the gap 130A according to the various widths of the indicator needle 30.

Further, in the magnet fixing implement 100 according to the first embodiment, the slit 102 includes the opening 102A at the outer peripheral edge of the main body 100A, and the rotation center portion 30A of the indicator needle 30 can be accommodated inside the slit 102, by sliding the rotation center portion 30A of the indicator needle 30 into the slit 102 from the opening 102A in the direction perpendicular to the rotation center AX2.

As a result, the magnet fixing implement 100 according to the first embodiment can easily and positively accommodate the rotation center portion 30A of the indicator needle 30 inside the slit 102.

Moreover, the magnet fixing implement 100 according to the first embodiment is integrally famed, using an elastic resin material.

Thus, the magnet fixing implement 100 according to the first embodiment can easily and positively integrally form the portion to be elastically deformed.

The magnet fixing implement 100 according to the first embodiment is formed by the injection molding of the resin material.

Accordingly, the magnet fixing implement 100 according to the first embodiment can be famed with an even higher accuracy.

Second Embodiment

Hereinafter, a second embodiment will be described, with reference to the drawings.

Configuration of Positioning Device 100

Figure 16:
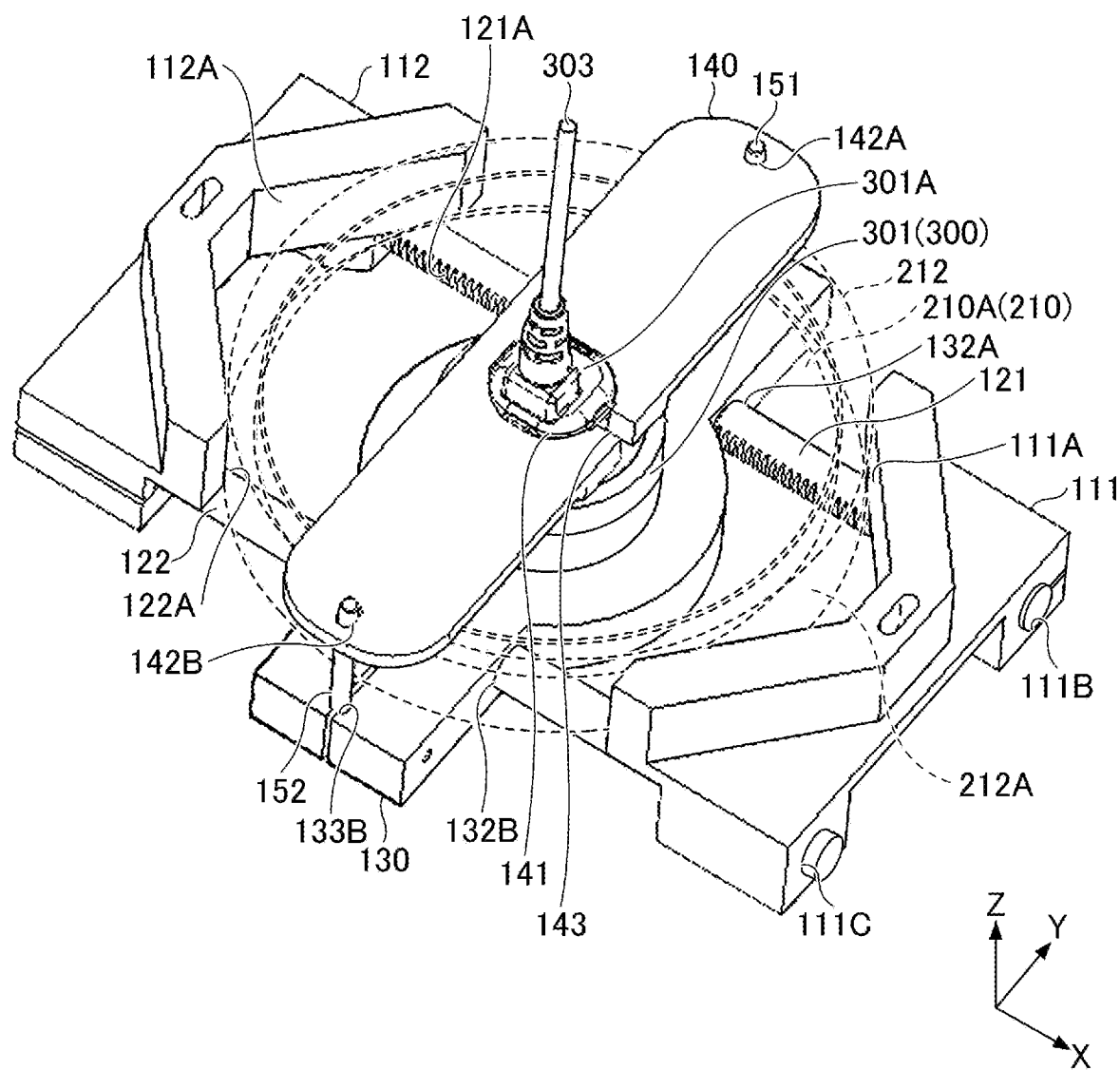
FIG. 16 is a perspective view of an external appearance of the positioning device according to a second embodiment viewed from above.
Figure 17:
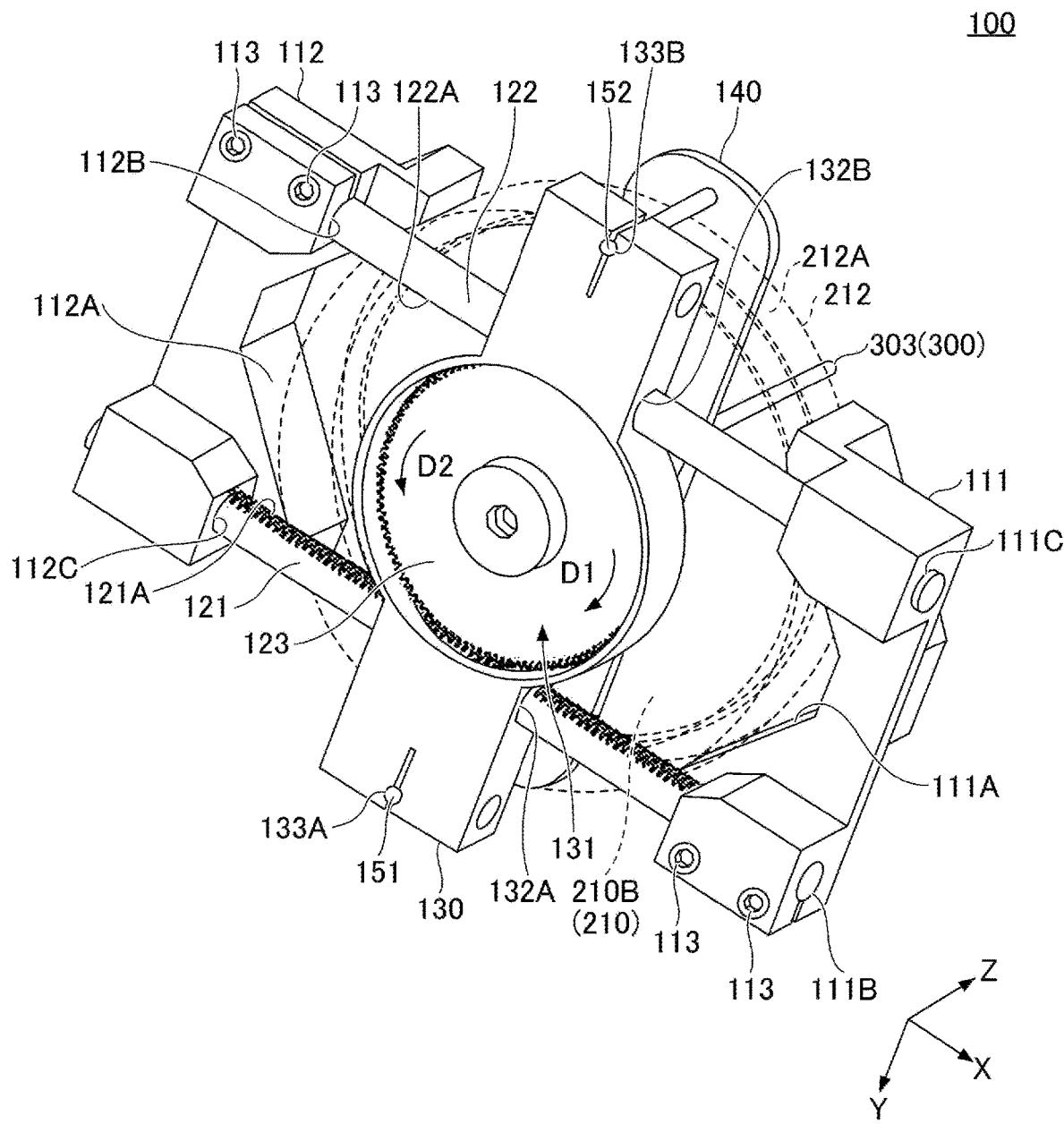
FIG. 17 is a perspective view of the external appearance of the positioning device according to the second embodiment viewed from below.

FIG. 16 is a perspective view of an external appearance of a positioning device 100 according to the second embodiment viewed from above. FIG. 17 is a perspective view of the positioning device 100 according to the second embodiment viewed from below. In the following description, for the sake of convenience, a direction perpendicular to a front surface 210A of a cover glass 210 of an analog meter 200 is regarded as the up-down direction (Z-axis direction). In addition, the side of the front surface 210A of the cover glass 210 is regarded as the upper side (positive side of the Z-axis), and a back surface side of the cover glass 210 is regarded as the lower side (negative side of the Z-axis).

The positioning device 100 illustrated in FIG. 16 is a device for positioning a sensor unit 300 with respect to a center of the front surface 210A of the generally circular and transparent cover glass 210 (an example of a "cover member") covering a display surface of the analog meter 200.

As illustrated in FIG. 16, positioning device 100 includes a pair of clamping members 111 and 112, two racks 121 and 122, a pinion gear 123, a center block 130, a positioning plate 140, and two pins 151 and 152. All of the components forming the positioning device 100 are formed of a relatively hard material (for example, a resin material, a metal material).

The pair of clamping members 111 and 112 is provided to oppose each other in the X-axis direction (one example of a "first direction"). The pair of clamping members 111 and 112 clamps an outer peripheral surface 212A of an outer frame 212 of the cover glass 210 provided in the analog meter 200. The pair of clamping members 111 and 112 is a so-called V-shaped block having support surfaces 111A and 112A forming a V-shape in the plan view viewed from above. The support surfaces 111A and 112A oppose each other. As illustrated in FIG. 16 and FIG. 17, the pair of clamping members 111 and 112 clamps the outer peripheral surface 212A by pressing against the outer peripheral surface 212A of the outer frame 212 by each of the support surfaces 111A and 112A.

In addition, the clamping member 111 includes a first through hole 111B and a second through hole 111C that are parallel to each other and penetrate the clamping member 111 in the X-axis direction. The first through hole 111B is provided on the clamping member 111 on the positive side of the Y-axis, and an end of the rack 121 on the positive side of the X-axis is inserted into the first through hole 111B. In the clamping member 111, an inner diameter of the first through hole 111B is reduced by tightening two screws 113 provided near the first through hole 111B, thereby fixing the end of the rack 121 on the positive side of the X-axis. The second through hole 111C is provided on the clamping member 111 on the negative side of the Y-axis, and an end of the rack 122 on the positive side of the X-axis is slidably inserted into the second through hole 111C.

Moreover, the clamping member 112 includes a first through hole 112B and a second through hole 112C that are parallel to each other and penetrate the clamping member 112 in the X-axis direction. The first through hole 112B is provided on the clamping member 112 on the negative side of the Y-axis, and an end of the rack 122 on the negative side of the X-axis is inserted into the first through hole 112B. In the clamping member 112, an inner diameter of the first through hole 112B is reduced by tightening two screws 113 provided near the first through hole 112B, thereby fixing the end of the rack 122 on the negative side of the X-axis. The second through hole 112C is provided on the clamping member 112 on the positive side of the Y-axis, and an end of the rack 121 on the negative side of the X-axis is slidably inserted into the second through hole 112C.

The two racks 121 and 122 are parallel to each other, and are provided to extend in the X-axis direction. The two racks 121 and 122 link the pair of clamping members 111 and 112, so that a separation distance of the pair of clamping members 111 and 112 is adjustable. The racks 121 and 122 are both a rod-shaped member extending linearly in the X-axis direction. The two racks 121 and 122 include a plurality of rack teeth 121A and 122A formed continuously in the X-axis direction on inner portions of the two racks 121 and 122, respectively.

The rack 121 is provided on the positive side of the Y-axis. The end of the rack 121 on the positive side of the X-axis is fixed to the clamping member 111, in a state where this end of the rack 121 is inserted through the first through hole 111B of the clamping member 111. The end of the rack 121 on the negative side of the X-axis is slidably inserted through the second through hole 112C of the clamping member 112.

The rack 122 is provided on the negative side of the Y-axis. The end of the rack 122 on the negative side of the X-axis is fixed to the clamping member 112, in a state where this end of the rack 122 is inserted through the first through hole 112B of the clamping member 112. The end of the rack 122 on the positive side of the X-axis is slidably inserted through the second through hole 111C of the clamping member 111.

The pinion gear 123 is provided in a circular accommodating space 131 famed on the back side of the center block 130, between the two racks 121 and 122. The pinion gear 123 is rotatable inside the accommodating space 131 of the center block 130. The pinion gear 123 engages each of the rack teeth 121A of the rack 121 and the rack teeth 122A of the rack 122. Hence, as the pinion gear 123 rotates, the pinion gear 123 can move the two racks 121 and 122 by the same amount in mutually different directions along the X-axis direction.

More particularly, in a case where the pinion gear 123 rotates clockwise (arrow D1) when viewed from the bottom side as illustrated in FIG. 17, the rack 121 is moved in the negative direction of the X-axis, and the rack 122 is moved in the positive direction of the X-axis by the same amount as the rack 121. In this case, the clamping member 111 fixed to the rack 121, and the clamping member 112 fixed to the rack 122, move by the same amount in directions so as to approach each other. Thus, the center block 130 maintains a state located at an intermediate position between the pair of clamping members 111 and 112.

In contrast, in a case where the pinion gear 123 rotates counterclockwise (arrow D2) when viewed from the bottom side as illustrated in FIG. 17, the rack 121 is moved in the positive direction of the X-axis, and the rack 122 is moved in the negative direction of the X-axis by the same amount as the rack 121. In this case, the clamping member 111 fixed to the rack 121, and the clamping member 112 fixed to the rack 122, move by the same amount in directions so as to separate from each other. Thus, the center block 130 maintains a state located at the intermediate position between the pair of clamping members 111 and 112.

The center block 130 is a block-shaped member extending in the Y-axis direction. The center block 130 extends perpendicularly to each of the two racks 121 and 122, and extends to outer sides of the two racks 121 and 122, respectively. A center of the center block 130 overlaps a center of the positioning device 100. The center of the center block 130 is always in a state overlapping the center of the positioning device 100, regardless of variations in the separation distance of the pair of clamping members 111 and 112. The "center of the positioning device 100" is the intermediate position between the pair of clamping members 111 and 112 in the X-axis direction, and is the intermediate position between the two racks 121 and 122 in the Y-axis direction.

As illustrated in FIG. 17, the center block 130 includes the circular housing space 131 at the center on the back side thereof. The housing space 131 accommodates the pinion gear 123 in a state rotatable around the center of the positioning device 100, as a rotation center thereof.

In addition, the center block 130 includes a first through hole 132A and a second through hole 132B that are parallel to each other and penetrate the center block 130 in the X-axis direction. The first through hole 132A is provided in the center block 130 on the positive side of the Y-axis, and the rack 121 is slidably inserted through the first through hole 132A. The first through hole 132A has an opening on the side of the accommodating space 131. Hence, the rack teeth 121A of the portion of the rack 121 inserted through the first through hole 132A can engage the pinion gear 123. The second through hole 132B is provided in the center block 130 on the negative side of the Y-axis, and the rack 122 is slidably inserted through the second through hole 132B. The second through hole 132B has an opening on the side of the accommodating space 131. Thus, the rack teeth 122A of the portion of the rack 122 inserted through the second through hole 132B can engage the pinion gear 123.

The positioning plate 140 is an example of a "positioning member". The positioning plate 140 is a flat member disposed to oppose an upper surface of the center block 130, and extends in the Y-axis direction. The positioning plate 140 extends perpendicularly to each of the two racks 121 and 122, and extends to the outer sides of the two racks 121 and 122, respectively. A center of the positioning plate 140 overlaps the center of the positioning device 100. The center of the positioning plate 140 always overlaps the center of the positioning device 100, regardless of the variations in the separation distance of the pair of clamping members 111 and 112.

A retaining hole 141 is formed at the center of the positioning plate 140. The retaining hole 141 has the same shape as an external shape of a protrusion 301A of a sensor case 301 provided in the sensor unit 300. By fitting the protrusion 301A of the sensor case 301 into the retaining hole 141, the positioning plate 140 can retain the sensor unit 300 so that the center of the positioning plate 140 coincides with the center of the sensor case 301. That is, by retaining the sensor unit 300, the positioning plate 140 can position the magnetic sensor 302 provided at the center of the sensor unit 300, with respect to the center of the front surface 210A of the cover glass 210.

Moreover, the positioning plate 140 includes a groove 143 cutout from an outer peripheral edge of positioning plate 140 and reaching retaining hole 141. The groove 143 is provided to pull a cable 303 of the sensor unit 300 from the retaining hole 141 toward the outer side of the positioning plate 140, when removing the positioning plate 140 from the sensor unit 300 after attaching the sensor unit 300 to the front surface 210A of the cover glass 210.

The two pins 151 and 152 engage both the center block 130 and the positioning plate 140, to position the positioning plate 140 at the intermediate position between the pair of clamping members 111 and 112. As described above, the center of the center block 130 is always in a state overlapping the center of the positioning device 100 (that is, the center of the front surface 210A of the cover glass 210), and does not depend on the variations in the separation distance of the pair of clamping members 111 and 112. The positioning device 100 according to the present embodiment positions the positioning plate 140 with respect to center block 130, by the two pins 151 and 152. Hence, similar to the center block 130, the positioning device 100 according to the present embodiment can position the center of the positioning plate 140 in the state overlapping the center of the positioning device 100 (that is, the center of the front surface 210A of the cover glass 210).

In the present embodiment, the two pins 151 and 152 having a round rod shape are used, for example. The pin 151 is provided on the positive side of the Y-axis. A lower end of the pin 151 is fixed in a state inserted through a support hole 133A formed in the center block 130 on the positive side of the Y-axis. An upper end of the pin 151 is inserted through a support hole 142A formed in the positioning plate 140 on the positive side of the Y-axis. Thus, the pin 151 positions the positioning plate 140 on the positive side of the Y-axis.

The pin 152 is provided on the negative side of the Y-axis. A lower end of the pin 152 is fixed in a state inserted through a support hole 133B formed in the center block 130 on the negative side of the Y-axis. An upper end of the pin 152 is inserted through a support hole 142B formed in the positioning plate 140 on the negative side of the Y-axis. Hence, the pin 152 positions the positioning plate 140 on the negative side of the Y-axis.

Method of Attaching Sensor Unit 300

Next, a method of attaching the sensor unit 300 using the positioning device 100 will be described.

(1) First, an operator pulls the pair of clamping members 111 and 112 in directions to separate from each other, to widen the separation of the pair of clamping members 111 and 112, and form a space for placing the cover glass 210 and the outer frame 212 on the upper surface of the center block 130. In this case, the center of the center block 130 maintains the state coinciding with the center of the positioning device 100.

(2) Next, the operator places the cover glass 210 and the outer frame 212 on the upper surface of the center block 130. Because the positioning device 100 according to the second embodiment can place the cover glass 210 and the outer frame 212 on the center block 130, it is relatively easy to perform the subsequent clamping by the pair of clamping members 111 and 112.

(3) Next, the operator pushes the pair of clamping members 111 and 112 in directions to close upon each other, to narrow the separation of the pair of clamping members 111 and 112, and cause the support surfaces 111A and 112A to make contact with the outer peripheral surface of the outer frame 212. Thus, the outer frame 212 is clamped by the pair of clamping members 111 and 112 according to the outer diameter of the outer frame 212, to align the center of the positioning device 100 to coincide with the center of the front surface 210A of the cover glass 210.

(4) Next, the operator fits the support holes 142A and 142B of the positioning plate 140 over the upper ends of the pins 151 and 152, respectively. As a result, the center of positioning device 100, the center of the front surface 210A of the cover glass 210, and the center of the positioning plate 140 coincide with one another.

(5) Next, the operator peels off the releasing paper of a double-sided tape adhered to a bottom surface of the sensor case 301, and fits the protrusion 301A of the sensor case 301 into the retaining hole 141 of the positioning plate 140. Thus, the center of the sensor case 301 coincides with the center of the front surface 210A of the cover glass 210.

(6) Next, the operator presses the sensor case 301 against the front surface 210A of the cover glass 210. Accordingly, the sensor case 301 is fixed to the front surface 210A of the cover glass 210, in a state where the center of the sensor case 301 coincides with the center of the front surface 210A of the cover glass 210.

(7) Next, the operator pulls the positioning plate 140 upward, and pulls the cable 303 from the retaining hole 141 of the positioning plate 140 through the groove 143 to the outer side of the positioning plate 140.

(8) Next, the operator removes the cover glass 210 and the outer frame 212 from the positioning device 100, and attaches the cover glass 210 and the outer frame 212 to a case 201 of the analog meter 200.

(9) Next, the operator fixes the cover glass 210 and the outer frame 212 to each other by a fixing means, such as a transparent tape or the like, so that the cover glass 210 does not rotate.

By the procedure described above, the operator can attach the sensor unit 300 to the front surface 210A of the cover glass 210, in the state where the center of the front surface 210A of the cover glass 210 of the analog meter 200 coincides with the center of the sensor case 301. Hence, the positioning device 100 according to the second embodiment can easily position the magnetic sensor 302 to the center of the analog meter 200, with respect to a plurality of kinds of analog meters 200 having different outer diameters.

Example of Installation of Sensor Unit 300

Figure 18:
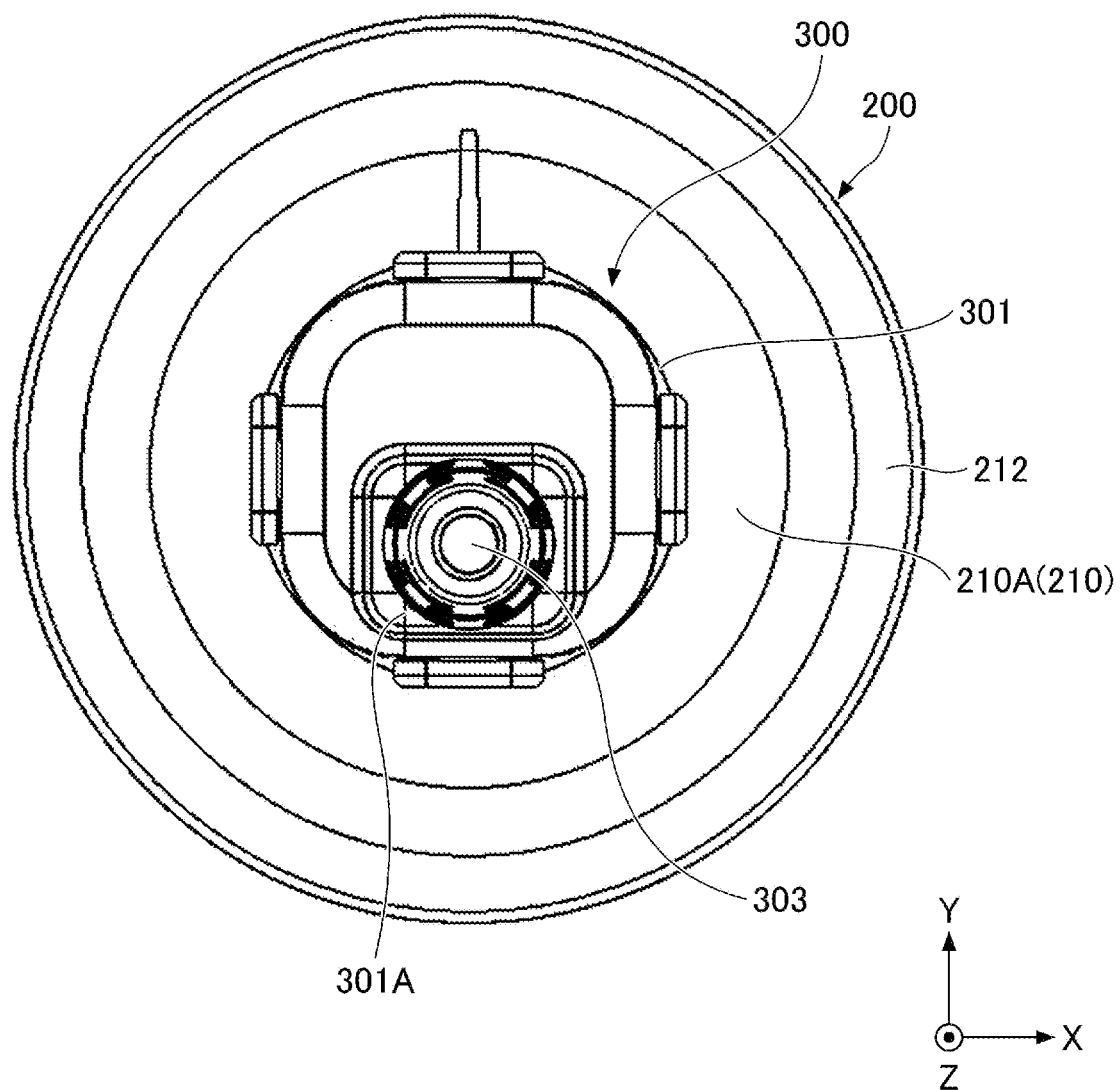
FIG. 18 is a plan view illustrating an example of an installation of a sensor unit to an analog meter according to the second embodiment.
Figure 19:
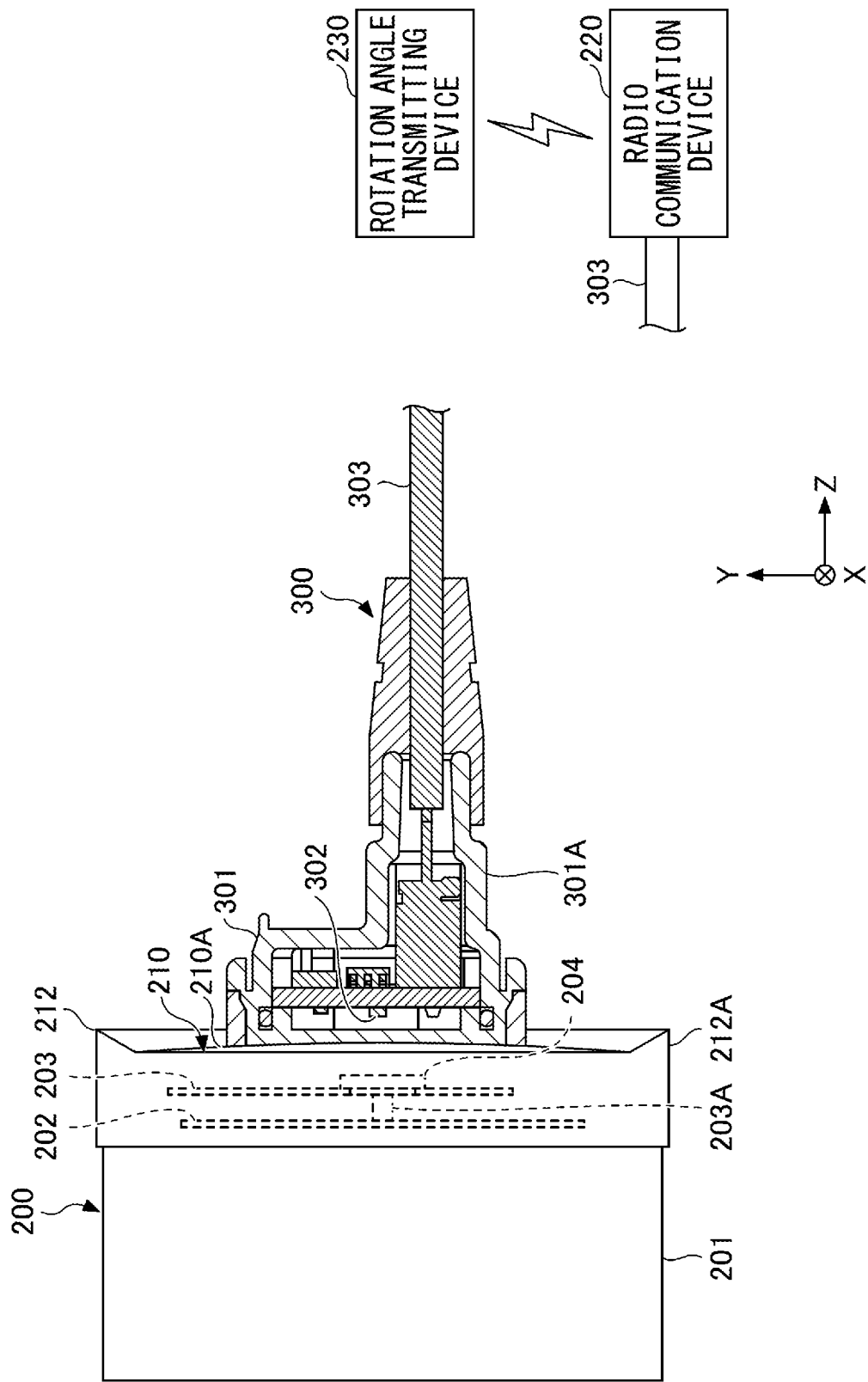
FIG. 19 is a side view illustrating the example of the installation of the sensor unit to the analog meter according to the second embodiment.

FIG. 18 is a plan view illustrating an example of an installation of the sensor unit 300 to the analog meter 200 according to the second embodiment. FIG. 19 is a side view illustrating the example of the installation of the sensor unit 300 to the analog meter 200 according to the second embodiment. In FIG. 19, a cross section is illustrated for the sensor unit 300.

The analog meter 200 illustrated in FIG. 18 is a water meter, a power meter, a gas meter, or the like, for example. As illustrated in FIG. 18, the analog meter 200 includes the case 201, a display surface 202, an indicator needle 203, a magnet 204, a cover glass 210, and the outer frame 212. The case 201 is a cylindrical member forming the external shape of the analog meter 200, and having a closed bottom surface. The display surface 202 is a horizontal surface facing the space above the analog meter 200, and provided inside the case 201. The display surface 202 has a circular shape in the plan view. A scale for representing various measured values in a stepwise manner is successively printed on the display surface 202 along a circumferential direction. The indicator needle 203 has the rotation shaft 203A, and rotates around the rotation shaft 203A as the rotation center thereof, to point and indicate a value of the scale printed on the display surface 202 according to various measured values. The magnet 204 has a disk shape, and is attached to the rotation center of the indicator needle 203. In the plan view, the magnet 204 is magnetized to the N pole and the S pole on respective sides of a boundary line passing through a center of the magnet 204. The cover glass 210 is an example of a "generally circular and transparent cover member", and is a transparent and disk-shaped glass member covering the display surface 202. The "generally circular and transparent cover member" is not limited to glass, and may be made of a resin. The outer frame 212 is a circular picture-frame-shaped member fitted into and attached to an edge of an opening in an upper side (positive side of the Z-axis) of the case 201. The outer frame 212 holds an outer peripheral edge of the cover glass 210 disposed on the inner side thereof.

As illustrated in FIG. 18 and FIG. 19, the sensor unit 300 is attached to the center of the front surface 210A of the cover glass 210 (that is, the rotation center of the indicator needle 203) provided in the analog meter 200, using the positioning device 100. The magnet 204 is provided at the center inside the sensor case 301 of the sensor unit 300, facing the analog meter 200 (negative side of the Z-axis). The magnetic sensor 302 opposes the magnet 204 attached to the rotation center of the indicator needle 203 of the analog meter 200, by attaching the sensor unit 300 to the center of the front surface 210A of the cover glass 210. Hence, the magnetic sensor 302 can magnetically detect the rotation angle of the indicator needle 203. Further, the sensor unit 300 transmits the rotation angle detection signal indicating the rotation angle detected by the magnetic sensor 302 to the rotation angle transmitter 230, via the cable 303 and a wireless communication device 220. For example, the sensor unit 300 successively detects the rotation angle of the indicator needle 203 at predetermined time intervals (for example, n second intervals), and successively transmits the rotation angle detection signal to the rotation angle transmitter 230 at predetermined time intervals (for example, n second intervals).

The rotation angle transmitter 230 receives the rotation angle detection signal transmitted from the sensor unit 300, and performs a predetermined process (for example, monitoring display, abnormal detection, recording, data transmission to other devices, or the like), using the rotation angle of the indicator needle 203 indicated by the rotation angle detection signal. For example, the rotation angle transmitter 230 transmits the rotation angle detection signal indicating the detected rotation angle to a gateway or cloud, via wireless communication (for example, BLUETOOTH™ wireless communication, SIGFOX™ wireless communication).

Extension Example of Positioning Device 100

Figure 20:
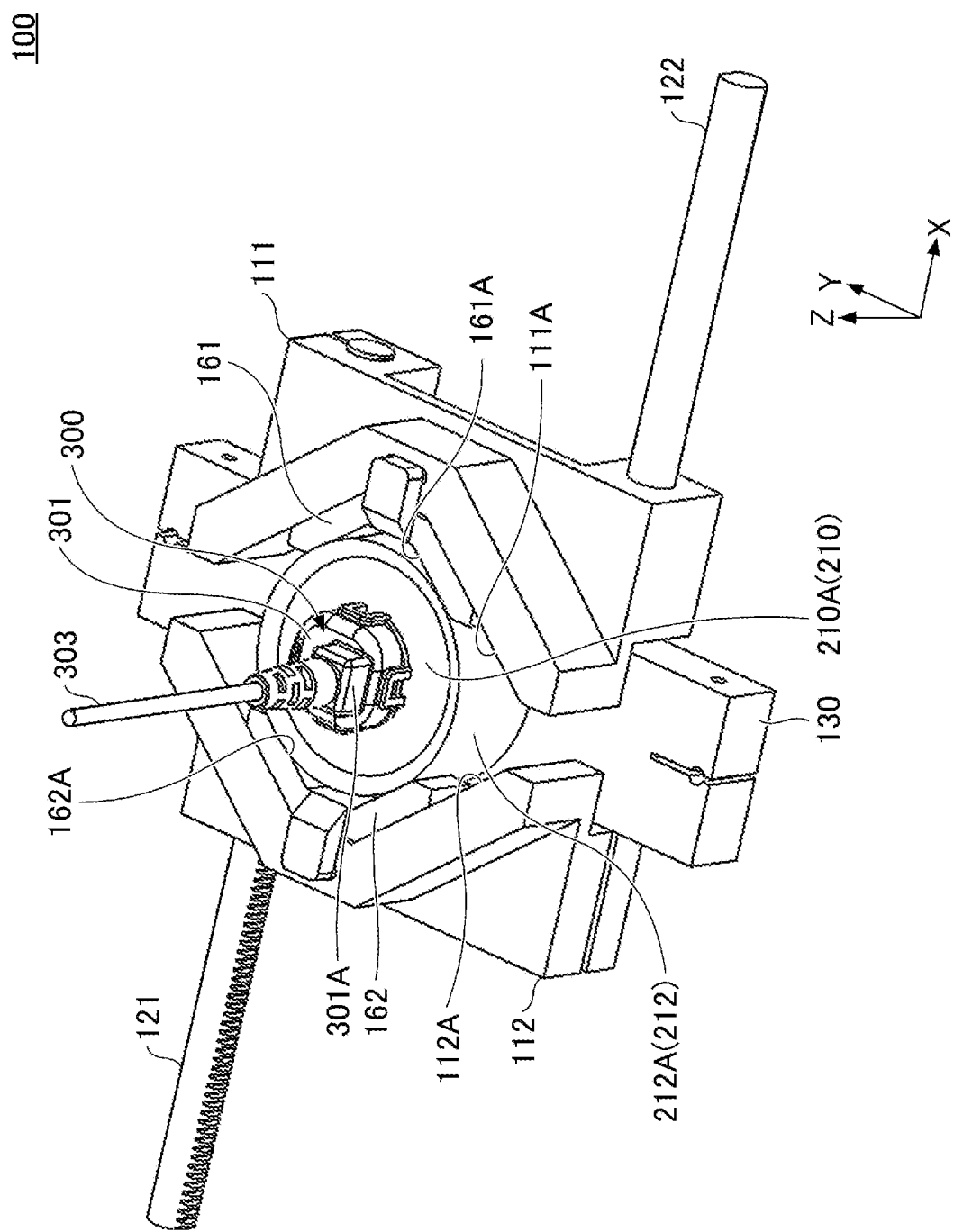
FIG. 20 is a diagram illustrating an extension example of the positioning device according to the second embodiment.

FIG. 20 is a diagram illustrating an extension example of the positioning device 100 according to the second embodiment. In the extension example illustrated in FIG. 20, the positioning device 100 further includes a pair of V-shaped adapters 161 and 162. The pair of V-shaped adapters 161 and 162 is attached to the support surfaces 111A and 112A of the pair of clamping members 111 and 112, so that each of the V-shaped support surfaces 161A and 162A can reduce a minimum diameter of the outer frame clampable by the pair of clamping members 111 and 112.

According to the present disclosure, it is possible to provide a magnet fixing implement for general purpose use, that can easily and positively fix a magnet to a rotation center portion of an indicator needle, in a state where a center of the magnet coincides with a rotation center of the indicator needle.

In addition, according to the present disclosure, a positioning device can easily position a magnetic sensor at a center of a meter, with respect to a plurality of kinds of meters having different outer diameters.

In the present specification, "generally circular" of "generally circular and transparent cover member" is not limited to a perfect circular shape, and may include cases where a protrusion, an irregularity, a cutout, or the like is provided in a portion of the circular shape. In other words, the "cover member" may have any shape that enables the "sensor unit" to be positioned at the center by the "positioning device".

Although the embodiments are numbered with, for example, "first," or "second," the ordinal numbers do not imply priorities of the embodiments. Many other variations and modifications will be apparent to those skilled in the art.

While embodiments of the present invention are described in detail above, the present invention is not limited to these embodiments, and various variations and modifications may be made within the scope of the present invention as recited in the claims.

What is claimed is:

1. A magnet fixing implement for fixing a magnet for rotation angle detection, attached to a rotation center portion of an indicator needle of an analog meter, comprising:
    a main body;
    a magnet holder provided on an upper surface of the main body, and configured to hold the magnet above the indicator needle;
    a slit formed in the main body in a flat shape perpendicular to a rotation center of the indicator needle, and configured to accommodate the rotation center portion of the indicator needle;
    a rotation shaft holder provided below the slit of the main body, and configured to hold a rotation shaft of the indicator needle; and
    an indicator needle restricting portion protruding toward an outer side from an outer peripheral edge of the main body, and configured to restrict a rotation of the indicator needle with respect to the main body.

2. The magnet fixing implement as claimed in claim 1, wherein the slit includes an opening at the outer peripheral edge of the main body, and the rotation center portion of the indicator needle is accommodatable inside the slit, by sliding the rotation center portion of the indicator needle into the slit from the opening in the direction perpendicular to the rotation center.

3. The magnet fixing implement as claimed in claim 1, which is made of an elastic resin material.

4. The magnet fixing implement as claimed in claim 1, wherein
    the main body includes a first elastic beam and a second elastic beam disposed below the slit and to oppose each other, and
    the rotation shaft holder is provided between the first elastic beam and the second elastic beam, and holds the rotation shaft by sandwiching the rotation shaft between the first elastic beam and the second elastic beam.

5. The magnet fixing implement as claimed in claim 4, wherein the main body includes a guide extending between the first elastic beam and the second elastic beam so that a width thereof gradually decreases from the outer peripheral edge of the main body toward the rotation shaft holder, and configured to guide the rotation shaft to the rotation shaft holder.

6. The magnet fixing implement as claimed in claim 1, wherein the indicator needle restricting portion includes
    a protrusion protruding from the outer peripheral edge of the main body in a longitudinal direction of the indicator needle, and
    a tongue extending from the protrusion in a width direction of the indicator needle, elastically deformable in a direction parallel to the rotation center, and configured to press down on the indicator needle.

7. The magnet fixing implement as claimed in claim 6, wherein
    the tongue is provided with an inclination from the protrusion, so that a gap between the tongue and the protrusion gradually widens in the direction parallel to the rotation center, and
    the indicator needle restricting portion holds both ends in the width direction of the indicator needle disposed in the gap, by a first contact surface of the protrusion exposed at the gap and a second contact surface of the tongue exposed at the gap.

8. The magnet fixing implement as claimed in claim 1, which is integrally formed, using an elastic resin material.

9. The magnet fixing implement as claimed in claim 8, which is formed by an injection molding of the resin material.

* * * * *